United States Patent
Sugii et al.

(10) Patent No.: US 6,936,875 B2
(45) Date of Patent: Aug. 30, 2005

(54) INSULATED-GATE FIELD-EFFECT TRANSISTOR, METHOD OF FABRICATING SAME, AND SEMICONDUCTOR DEVICE EMPLOYING SAME

(75) Inventors: Nobuyuki Sugii, Tokyo (JP); Kazuhiro Ohnishi, Kodaira (JP); Katsuyoshi Washio, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/673,789

(22) Filed: Sep. 30, 2003

(65) Prior Publication Data

US 2004/0108559 A1 Jun. 10, 2004

(30) Foreign Application Priority Data

Oct. 2, 2002 (JP) ..................................... P2002-289655

(51) Int. Cl.[7] ............................................. H01L 21/336
(52) U.S. Cl. .......................... 257/288; 257/63; 257/616
(58) Field of Search ........................... 257/288, 63, 616

(56) References Cited

U.S. PATENT DOCUMENTS

| 6,403,981 B1 | 6/2002 | Yu ............................... 257/63 |
| 6,475,869 B1 | 11/2002 | Yu ............................... 438/303 |
| 6,563,152 B2 | 5/2003 | Roberds et al. ............. 257/288 |

FOREIGN PATENT DOCUMENTS

| JP | 9-321307 | 12/1997 |
| JP | 2000-286418 | 10/2000 |
| JP | 2002-16255 | 1/2002 |
| JP | 2003-17710 | 1/2003 |

OTHER PUBLICATIONS

Hisamoto et al., "A Folded–channel MOSFET for Deep–sub–tenth Micron Era," Proceedings of the International Electronic Device Conference (IEDM), 1988, pp. 1032–1034.

*Primary Examiner*—Long Pham
(74) *Attorney, Agent, or Firm*—Miles & Stockbridge P.C.

(57) ABSTRACT

With the invention, it is possible to avoid deterioration in short-channel characteristics, caused by a silicon germanium layer coming into contact with the channel of a strained SOI transistor. Further, it is possible to fabricate a double-gate type of strained SOI transistor or to implement mixedly mounting the strained SOI transistor and a conventional silicon or SOI transistor on the same wafer. According to the invention, for example, a strained silicon layer is grown on a strain-relaxed silicon germanium layer, and subsequently, portions of the silicon germanium layer are removed, thereby constituting a channel layer in the strained silicon layer.

11 Claims, 32 Drawing Sheets

DIRECTION OF TENSILE STRAIN

DIRECTION OF TENSILE STRAIN

FIG.32B
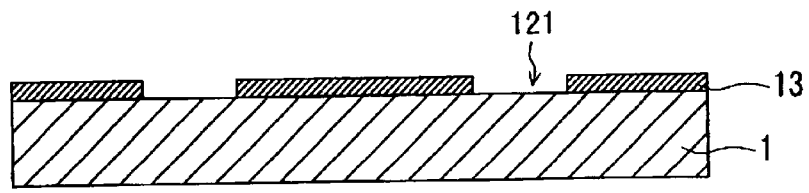
FIG.32A       FIG.32C
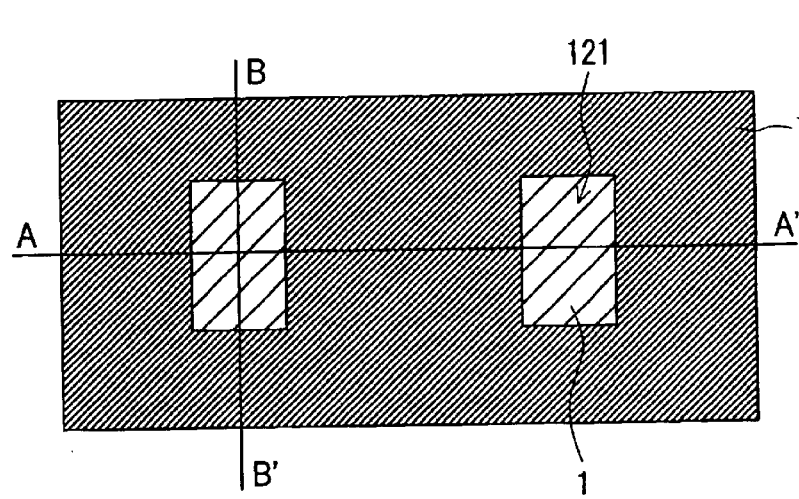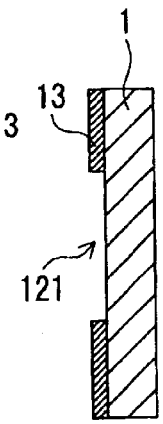
FIG.33
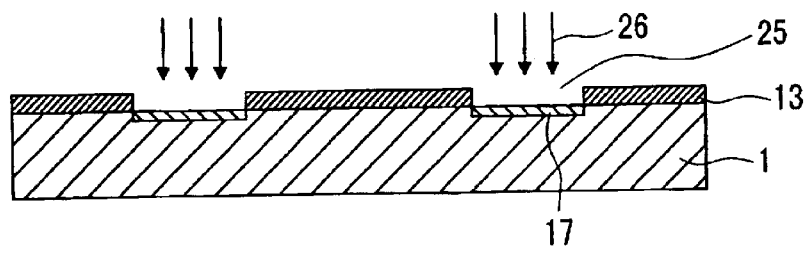

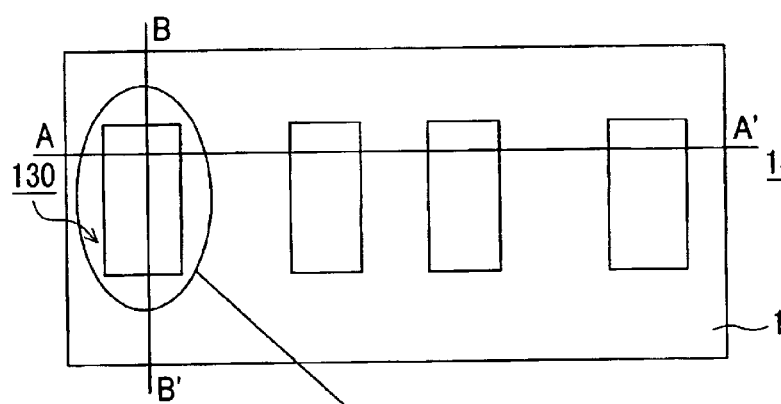
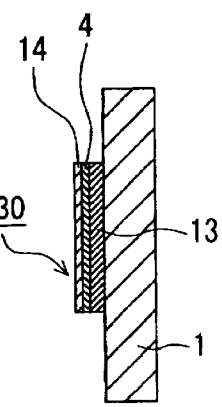
FIG.44A  FIG.44B
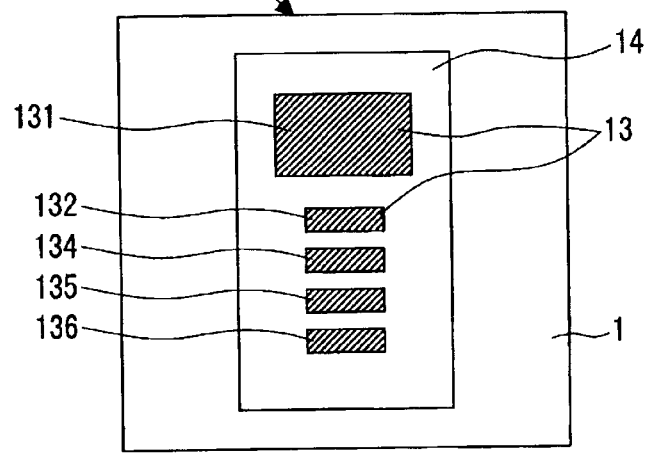

INSULATED-GATE FIELD-EFFECT TRANSISTOR, METHOD OF FABRICATING SAME, AND SEMICONDUCTOR DEVICE EMPLOYING SAME

BACKGROUND OF THE INVENTION

1. Field of the Invention

The present invention relates to an insulated-gate field-effect transistor having high-mobility channel and a short gate length, and a method of fabricating the same. Further, the present invention is concerned with a semiconductor device employing the insulated-gate field-effect transistors. The transistor according to the present invention is useful when applied to a semiconductor device for use in an electronic circuit including a logic circuit, an analog circuit, and so on, particularly, in a field where high speed and low power consumption are required.

2. Description of the Related Art

In the case of a silicon semiconductor device, particularly, a field effect transistor, larger scale integration of a circuit has so far been realized and higher performance thereof has been obtained by downsizing the device. However, when the gate of a transistor is e.g., a size less than 50 nm, it has become extremely difficult to achieve high performance through downsizing only. For such a hyperfine device, it has become advantageous to use the so-called SOI (Silicon-on-Insulator) structure wherein a thin silicon layer in an active region is laid on top of an insulator layer, in place of a device which has thus far been in widespread use, wherein a region near the surface of a single crystal silicon substrate is used as an active region thereof.

Among other things, a double-gate structure with a channel layer, sandwiched between gates disposed on opposite-sides thereof, is regarded the most advantageous structure for operation of a hyperfine device. As for the double-gate structure, a structure and a method of fabricating the same are disclosed in, for example, JP-A No. 16255/2002. Another form of the double-gate structure is a structure called the fin-shaped double-gate structure (referred to as a FinFET). An example thereof is shown in, for example, proceedings of International Electronic Device Conference (IEDM), 1988, pp. 1032–1034.

Meanwhile, attention has lately been focused on use of a strained silicon transistor instead of attempting to enhance performance simply through downsizing thereof. The strained silicon transistor is a transistor wherein carrier mobility is enhanced by applying strain to silicon in an attempt to increase performance of the device. As shown in, for example, Nikkei Electronics, issue of Jul. 16, 2001, pp. 63–67, an example thereof is capable of improving its performance on the order of 35% provided that the gate size thereof remains the same. Further, another example of a strained SOI transistor is shown in, for example, JP-A No. 321307/1997. However, with the device shown in JP-A No. 321307/1997, there has been the need for a strain-relaxed silicon germanium layer invariably being in contact with a strained silicon channel in order to maintain strain. Therefore, according to JP-A No. 286418/2000, it has been described that a silicon germanium layer is removed in a stage of fabricating a substrate.

Now, drawbacks of the strained SOI transistor tackled so far will be described. For example, a structure shown in JP-A No. 321307/1997 is that of the conventional, representative strained SOI transistor. With this example, presence of a silicon germanium layer to apply strain is invariably required underneath the strained silicon to serve as a channel. However, in the case of a hyperfine device, it is also necessary to reduce the thickness of the channel layer, corresponding to a miniaturization in gate size, in order to reduce leakage current from the source to the drain, that is, a so-called punch-through current. With the conventional strained SOI, it has been impossible to sufficiently reduce the thickness of the layer upon the insulator layer because of the need for presence of the silicon germanium layer. Further, the silicon germanium layer has lower energy against holes as compared with the strained silicon. Accordingly, there has occurred a problem that a p-type transistor is more susceptible to occurrence of punch-through.

Furthermore, one drawback of substrates employed previously is that they have required a fabrication process using a special method of bonding, among other things, and consequently, fabrication cost thereof becomes higher in comparison with a conventional Si or SOI substrate.

SUMMARY OF THE INVENTION

The present invention has been developed to resolve various problems of the conventional technology, and is intended to provide an insulated-gate field-effect transistor having high mobility and a short gate length. Further, another object of the present invention is to provide a double-gate transistor that can be fabricated with ease. Still another object of the present invention is to provide a new semiconductor device by forming transistors having different characteristics on the same substrate with ease.

The present invention essentially provides an insulated-gate field-effect transistor comprising first and second impurity regions placed so as to oppose each other, a strained silicon layer having a channel between both the first and second impurity regions, a gate insulator placed at least in a region corresponding to the channel, on top of the strained silicon layer, and a gate electrode on top of the gate insulator, wherein a region of the strained silicon layer, corresponding to the channel, does not have a silicon germanium layer in contact therewith, and the strained silicon layer, in regions other than the region corresponding to the channel, has regions where the silicon germanium layer is in contact therewith.

The present invention adopts a structure wherein both ends of the strained silicon layer are in contact with the silicon germanium layer so as to hold the strained silicon layer. The channel of the insulated-gate field-effect transistor can be formed in the strained silicon layer structured in this way by use of either a side thereof, parallel to a substrate, or a side thereof, intersecting the substrate. That is, a so-called vertical transistor or horizontal transistor can be structured.

Further, the present invention can provide a fin-shaped transistor structured with bar-shaped strained silicon layers. In this case, a plurality of the bar-shaped strained silicon layers may be placed and a bar-shaped silicon germanium layer may be left out so as to be placed between the bar-shaped strained silicon layers adjacent to each other.

Still further, the strained silicon layer may be placed in the upper part of the substrate and a void may exist in a region on a side adjacent to the substrate, opposite from a face of the strained silicon layer. In addition, a form may be adopted wherein an insulating film exists in the region on the side adjacent to the substrate, opposite from the face of the strained silicon layer.

Examples of a method of fabricating an insulated-gate field-effect transistor, according to the invention, are as follows.

The method of fabricating the insulated-gate field-effect transistor, according to a first form, comprises the steps of preparing a silicon substrate, forming an oxide film on the surface of the silicon substrate, defining an opening by etching a portion of the oxide film, implanting ions into the opening, causing silicon germanium seed crystals to grow in the opening; depositing amorphous silicon germanium on top of the opening and the oxide film, heating the amorphous silicon germanium to form silicon germanium crystals, and depositing a strained silicon layer on top of the silicon germanium crystals.

The method of fabricating the insulated-gate field-effect transistor, according to a second form, comprises the steps of preparing a silicon substrate, forming an oxide film on the surface of the silicon substrate, defining an opening by etching a portion of the oxide film, causing silicon germanium seed crystals to grow in the opening, oxidizing the surface of the silicon germanium seed crystals, subjecting the silicon germanium seed crystals to high-temperature heat treatment, removing an oxide film on the surface of the silicon germanium seed crystals, depositing amorphous silicon germanium on top of the opening and the oxide film, heating the amorphous silicon germanium to form silicon germanium crystals, and depositing a strained silicon layer on top of the silicon germanium crystals.

Furthermore, additional methods of fabricating the insulated-gate field-effect transistor will be described later.

BRIEF DESCRIPTION OF THE DRAWINGS

FIG. 32A is a plan view for illustrating the principal part of a device according to Embodiment 6 of the invention, in the order of steps of fabrication, FIG. 32B is a sectional view taken on line A–A' in FIG. 32A, and FIG. 32C is a sectional view taken on line B–B' in FIG. 32A;

FIG. 33 is a sectional view for illustrating the principal part of the device according to Embodiment 6 of the invention, in the order of the steps of fabrication;

FIG. 44A is an enlarged plan view of one of island-like portions in FIG. 43, and FIG. 44B is a sectional view taken on line B–B' in FIG. 44A;

DETAILED DESCRIPTION OF THE PREFERRED EMBODIMENTS

Figure 1A:
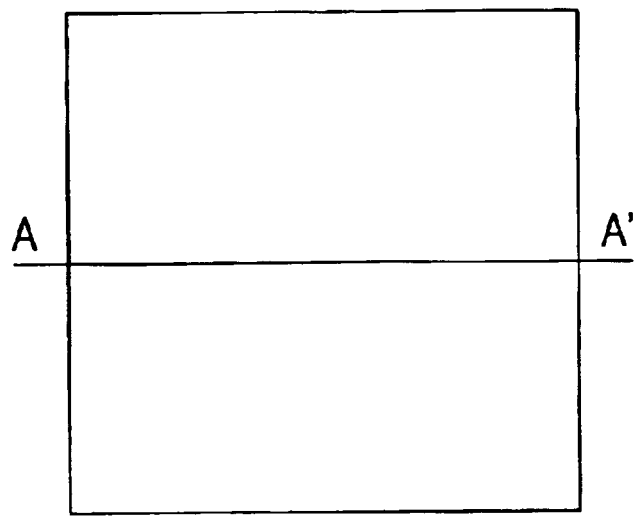
FIG. 1A is a plan view of a strained silicon/strain-relaxed silicon germanium substrate according to Embodiment 1 of the invention.

Before describing specific embodiments of the invention, various techniques used in carrying out the invention are described in detail hereinafter.

The inventors have studied various structures, and a method of fabricating the same to find out whether it is possible to implement an insulated-gate field-effect transistor having high-mobility channel and a short gate length by a simpler method. Details of various methods based on these studies will be described later. The structures studied include:

(1) a structure without a silicon germanium layer provided directly underneath a strained silicon channel with greater ease
(2) a device structure with double gates, capable of having a strained SOI structure
(3) a device structure wherein strained a silicon or strained SOI transistor and a conventional MOS or conventional SOI-MOS transistor can coexist on the same wafer.

For a substrate for crystal growth, adopted in the present invention, use is made of a strained silicon substrate or strained SOI substrate, with a silicon germanium layer formed on the surface thereof. Otherwise, it goes without saying that the substrate for crystal growth may be prepared by using a conventional silicon substrate or SOI substrate, and forming a silicon germanium layer thereon by epitaxial growth. Further, such a substrate can be prepared by, for example, the following method. A strain-relaxed silicon germanium substrate can be obtained by coating the top of a silicon germanium layer formed on a SOI substrate with an insulating film, partially melting the silicon germanium layer, and thereafter, causing germanium to be diffused into a silicon layer on top of the insulating film, thereby solidifying the same. This method is discussed in, for example, patent application JP-B No. 211801/2001.

That is, whichever means are adopted, a strained silicon layer is formed on top of the silicon germanium layer. A method of depositing the silicon germanium layer on top of an insulator will be described in detail later.

Thus, by forming the strained silicon layer on the substrate for crystal growth, an active region of a relevant semiconductor device is prepared, and one of methods according to the invention adopts a way of forming a strained silicon layer on top of a silicon germanium layer, and subsequently, removing a portion of the silicon germanium layer, corresponding to a channel region, in order to reduce thickness of at least a channel layer as much as possible. In other words, by selectively removing a portion of the silicon germanium layer, in contact with a portion of the strained silicon layer, where a channel is to be formed, an excess of thickness of a channel portion can be eliminated. In addition, with a p-type transistor, since the portion of the silicon germanium layer in contact with the strained silicon layer is removed, it becomes possible to prevent punch-through by current flowing through a portion of the silicon germanium layer where the silicon germanium has been left out of the layer, or has been removed from the layer.

In this case, instead of removing the silicon germanium layer in whole, portions of the silicon germanium layer are left out, thereby enabling the strain in the strained silicon layer to be retained, and mechanical retention of these portions to be implemented. Normally, portions of the silicon germanium layer, opposite to both ends of the strained silicon layer, in the longitudinal direction thereof, respectively, are left intact to serve as retaining parts for the strained silicon layer.

An insulated-gate field-effect transistor is formed on the strained silicon layer as described above. As for a method of fabricating the insulated-gate field-effect transistor itself, various common methods may be used.

That is, with a portion of the silicon germanium layer, directly underneath the channel, removed, a gate insulator and a gate electrode are formed on top of the strained silicon layer where a channel is formed. Further, a source region and a drain region are formed on opposite sides of the gate electrode, respectively, so as to sandwich the gate electrode therebetween, thereby fabricating an insulated gate transistor. In this case, the silicon germanium layer may be left out in regions corresponding to the source and drain regions, respectively.

The present invention is not limited to a single-gate transistor, but can naturally adopt a double-gate structure as well. That is, by newly forming a gate insulator and a gate electrode in the portion of the strained silicon layer, directly underneath the channel where the silicon germanium layer has been removed, the double-gate structure can be adopted.

Now, a structure, as easily fabricated as the double-gate structure, is a structure called the fin-shaped double-gate transistor (also known as FinFET). One representative of this form is a structure wherein a silicon layer on the top surface of a substrate is etched to thereby leave out fin-shaped portions thereof, each serving as a channel, and a gate is formed so as to spread across respective fin-shapedchannels. Current flows in parallel with the top surface of the substrate, and in the longitudinal direction of respective fins. A gate is formed on both sides of the respective fins, thereby forming a double-gate structure. Accordingly, even if a gate length becomes hyperfine, this structure is insusceptible to punch-through.

With the present invention, strain is caused to occur to the fin-shaped silicon layer, so that a high performance transistor can be fabricated.

In order to apply strain to the silicon layer, it is necessary to grow silicon onto silicon germanium. However, by depositing simply one on the other, the silicon germanium layer cannot be removed thereafter. Accordingly, a substrate with a silicon germanium layer deposited on insulator is first prepared. Portions of the silicon germanium layer are removed by etching to thereby expose the insulator, and subsequently, selective growth of silicon is caused to take place in the portions of the silicon germanium layer, other than the exposed insulator. By so doing, it is possible to grow strained silicon on sidewalls of the silicon germanium layer. Subsequently, by selective removal of silicon germanium, the strained silicon in rectangular shape or fin-like shape can be left out on top of the insulator. Otherwise, a strained silicon layer may be formed in the middle of the silicon germanium layer, and this strained silicon layer, buried in the silicon germanium layer, can be used as an etch-stop layer. In this case, the topmost strained silicon layer is first removed partially from the surface to thereby expose the silicon germanium layer, and further, by selective etching of silicon germanium, the silicon germanium layer is etched until the strained silicon layer inside the silicon germanium layer is exposed.

For a method of selective etching of silicon germanium, the following method is preferably used. For wet etching, a hydrogen peroxide/ammonia based solution is used, and for dry etching, an oxygen/fluorine based gas is used. By so doing, an etch rate for silicon germanium is greater than that for silicon. In this connection, needless to say, an etching solution and an etching gas are not limited to substances as described above by way of example.

Further, the silicon germanium layer may be formed on the entire surface of the substrate, or, alternatively, may be formed on a part of the surface corresponding to a part thereof on which a semiconductor device is to be formed.

With another method disclosed in the present invention, it is possible to fabricate the device by using a conventional silicon substrate. Such a method is briefly described hereinafter.

First, an oxide film is formed on the surface of a silicon substrate, and openings are defined by etching portions of the oxide film. After implantation of ions into the openings, selective epitaxial growth of a silicon germanium layer is done in portions of the surface other than the oxide film. At this point, since the ions have been implanted in a film-forming region, strain caused by misfit between silicon germanium and silicon is easily relaxed.

Further, after an amorphous silicon germanium film is formed on the entire surface, the amorphous silicon germanium film is subjected to heat treatment to thereby undergo solid phase crystallization. At this point, amorphous silicon germanium in contact with the silicon germanium layer that has undergone the epitaxial growth becomes crystallized sooner than silicon germanium formed on the oxide film, and thereafter, lateral solid phase crystallization of the amorphous silicon germanium film occurs on top of the oxide film.

The silicon germanium layer that has undergone the epitaxial growth in the foregoing step includes a defect due to misfit thereof with the silicon substrate, and grain boundaries are formed in the central portion of the silicon germanium layer on the oxide film due to collisions between crystal grains that have undergone crystal growth in the lateral direction from both sides of the central portion. Since the defect and the grain boundaries as described hinder the operation of a transistor, these are removed by etching. As a result, only a high crystal-quality portion of the silicon germanium layer, formed due to crystal growth in the lateral direction, can be left out; this may be in the form of an island. Further, since this silicon germanium layer has undergone crystal growth using a portion thereof, where the strain cause by misfit thereof with the silicon substrate has been relaxed in the process of the epitaxial growth, as a seed, the strain thereof is similarly relaxed, so that silicon can be provided with strain when the silicon layer is epitaxially grown on the silicon germanium layer.

The strain of the strained silicon layer described above is in a range of 0 to 4%, preferably in a range of 0 to 2%, in a tensile direction in a plane parallel with a flow direction of a transistor current. A germanium content of the silicon germanium layer, necessary for providing such strain, is in a range of 0 to 100%, preferably in a range of 0 to 50%. Further, thickness of the strained silicon layer, necessary for retaining the strain described, is in a range of 5 to 100 nm, preferably in a range of 5 to 50 nm. If the upper limit is exceeded, there occurs dislocation inside the strained silicon layer, causing deterioration in the characteristics of a transistor. If the thickness of the strained silicon layer is less than the lower limit, the thickness thereof becomes equivalent to, or less than the thickness of the channel (inversion layer) of the transistor, so that there will be an increase in scattering of carriers, thereby causing deterioration in the characteristics of the transistor.

Embodiment 1

Embodiment 1 is concerned with a method of fabricating an insulated-gate field-effect transistor for which a novel planar configuration is devised for removal of a portion of a silicon germanium layer, directly underneath a strained silicon layer.

Figure 1B:
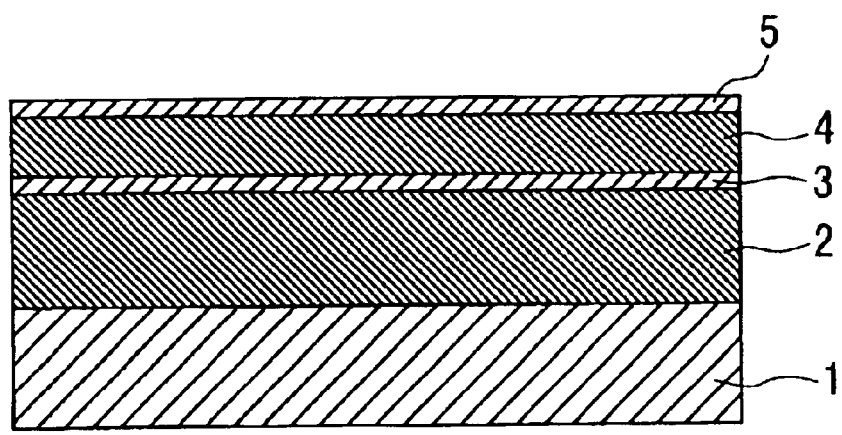
FIG. 1B is a sectional view taken on line A–A' in FIG. 1A.

FIGS. 1 through 9 are schematic illustrations showing a semiconductor device in the order of steps of the method of fabricating the same according to the present embodiment. FIG. 1 shows a strained silicon/strain-relaxed silicon germanium substrate by way of example. FIG. 1A is a plan view of the substrate and FIG. 1B is a sectional view taken on line A–A' in FIG. 1A. Suffix "A" of FIGS. 1 through 9, respectively, indicates a plan view of a base body, suffix "B" is a sectional view taken on line A–A' in "A" of the respective figures, and suffix "C" is a sectional view taken on line B–B' in "A" of the respective figures. Only FIGS. 5 through 9 are provided with suffix "C".

The strained silicon/strain-relaxed silicon germanium substrate shown in FIG. 1 is first prepared. Herein, a substrate having at least strained silicon layer/strain-relaxed silicon germanium layer, in the upper part of a silicon substrate, is called "strained silicon/strain-relaxed silicon germanium substrate". This substrate can be fabricated by forming a strain-relaxed silicon germanium layer 2, a strained silicon layer 3, a strain-relaxed silicon germanium layer 4, and a strained silicon layer 5, in that order, on top of a conventional silicon substrate 1, by use of a conventional epitaxial growth method. The respective layers have film thickness of, for example, 2000 nm, 10 nm, 50 nm, and 20 nm, for the strain-relaxed silicon germanium layer 2, strained silicon layer 3, strain-relaxed silicon germanium layer 4, and strained silicon layer 5, respectively.

The strain-relaxed silicon germanium layer can be formed by the low pressure (LP) chemical vapor deposition (CVD) method using, for example, monosilane gas or dichlorosilane gas and germane gas as source materials. The growth temperature is on the order of 850° C. Successive growth of the strained silicon layers can be executed by stopping feeding of the germane gas. Further, by mixing gases for doping with impurities, such as diborane gas, arsine gas, etc. as appropriate, the conductivity of respective films can be controlled.

Figure 2A:
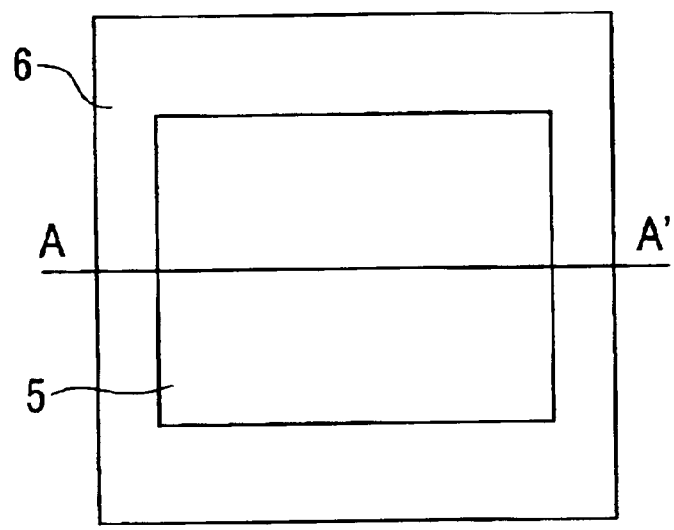
FIG. 2A is a plan view for illustrating the principal part of a device according to Embodiment 1 of the invention, in the order of steps of fabrication.
Figure 2B:
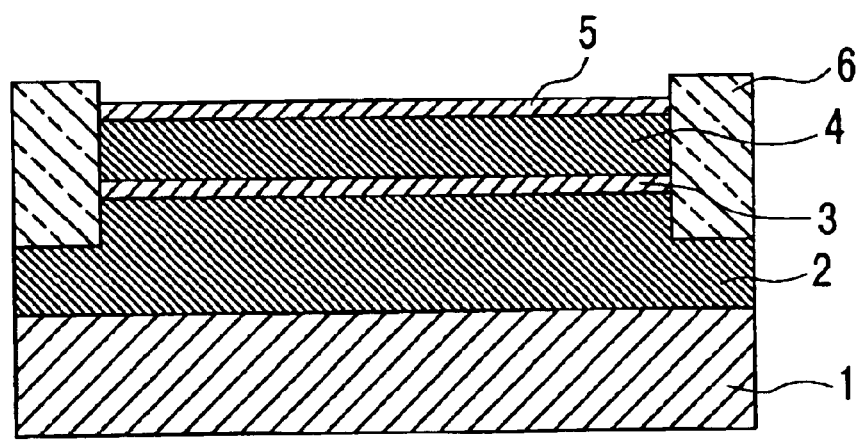
FIG. 2B is a sectional view taken on line A–A' in FIG. 2A.

Subsequently, as shown in FIG. 2, an isolation region 6 is formed. For a method of forming the same, the so-called shallow trench isolation (STI) method, which is common employed, is used. That is, a mask is formed by the common photolithographic process, and a trench is formed to a desired depth (300 nm in the case of the present embodiment) by dry etching. Then, an insulating film made of silicon dioxide ($SiO_2$) is imbedded in the trench by, for example, a high pressure plasma enhanced CVD method. Thereafter, planarization treatment is applied to the base body by use of a chemical mechanical polishing (CMP), for example.

Figure 3A:
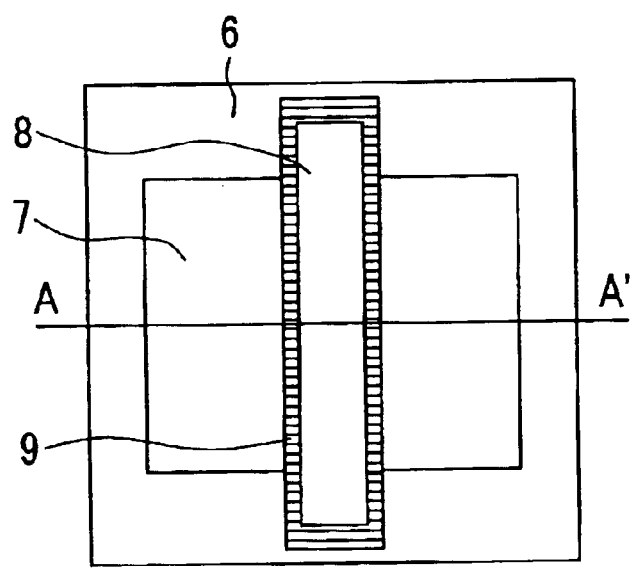
FIG. 3A is a plan view for illustrating the principal part of the device according to Embodiment 1 of the invention, in the order of the steps of fabrication.
Figure 3B:
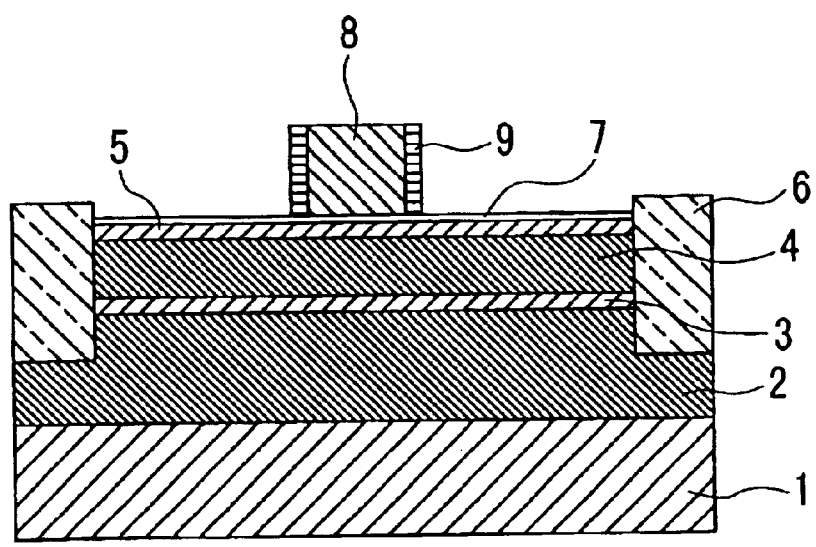
FIG. 3B is a sectional view taken on line A–A' in FIG. 3A.

Further, as shown in FIG. 3, a gate insulator 7 is formed by the well-known method, and on top thereof, a gate electrode film is formed. Thereafter, the gate electrode film is worked into a desired shape, thereby forming a gate electrode 8. Further, a gate sidewall 9 is formed to serve as a sidewall of the gate electrode 8. With the present embodiment, silicon nitride (SiN) is used for the gate sidewall 9. As shown in the plan view of FIG. 3A, the gate electrode 8 and the gate sidewall film 9 are formed such that respective regions thereof, in the longitudinal direction (that is, in the direction crossing line A–A' in FIG. 3A at right angles), extend from a region including an active region (that is, the active region corresponding to a region in FIG. 3A where the gate insulator 7 is shown) to the isolation region 6.

After formation of the gate electrode 8, ions are implanted into the strained silicon layer 5, thereby forming source/drain extensions. As is well known, n-channel and p-channel transistors can be formed, respectively, by varying an ion species. Thereafter, a film for the gate sidewall 9 is formed.

Figure 4A:
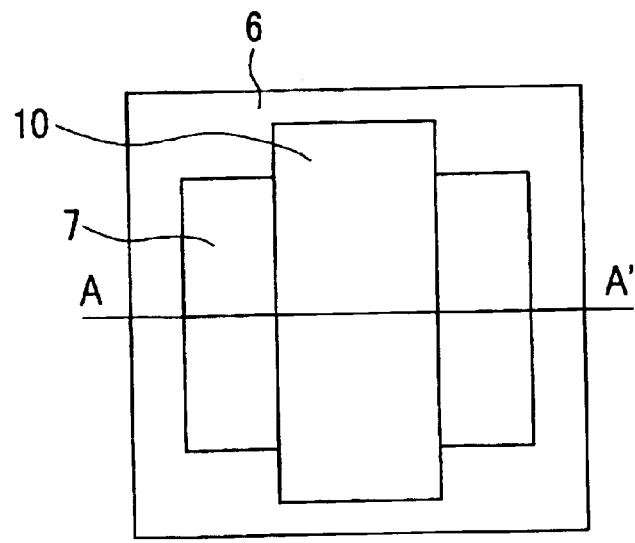
FIG. 4A is a plan view for illustrating the principal part of the device according to Embodiment 1 of the invention, in the order of the steps of fabrication.
Figure 4B:
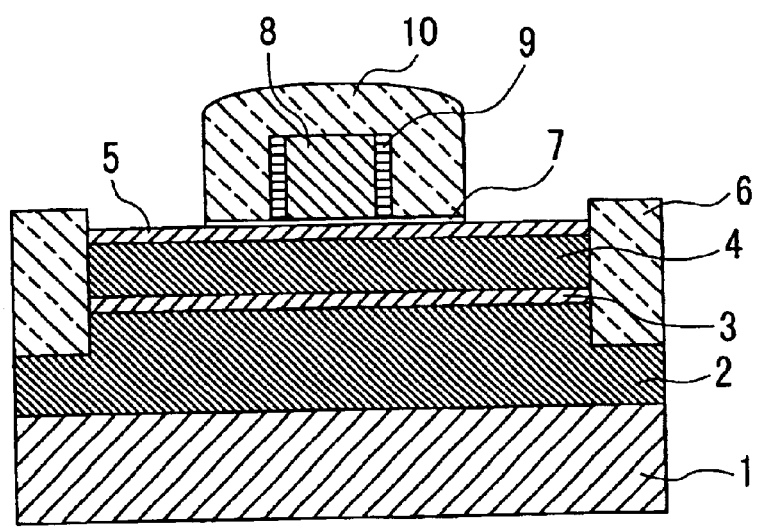
FIG. 4B is a sectional view taken on line A–A' in FIG. 4A.

Subsequently, as shown in FIG. 4, a second gate sidewall 10 is formed on the outside of the gate sidewall 9. With the present embodiment, for the second gate sidewall 10, use is made of a silicon dioxide ($SiO_2$) film formed by a plasma enhanced CVD method using a TEOS gas as a feed material. The second gate sidewall 10 is formed to a thickness of, for example, 50 nm.

Figure 5A:
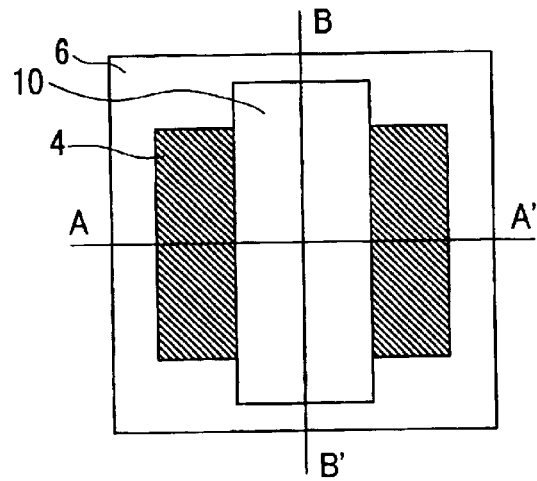
FIG. 5A is a plan view for illustrating the principal part of the device according to Embodiment 1 of the invention, in the order of the steps of fabrication.
Figure 5B:
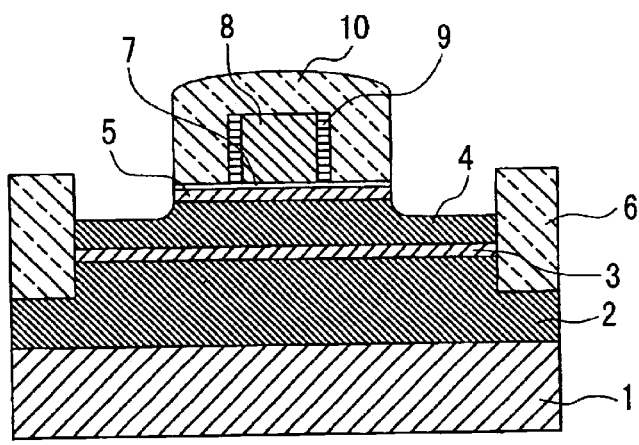
FIG. 5B is a sectional view taken on line A–A' in FIG. 5A.

Further, as shown in FIGS. 5A, and 5B, portions of the strained silicon layer 5, and the strain-relaxed silicon germanium layer 4, in upper layers, respectively, are etched by use of the second gate sidewall 10 as a mask.

Figure 5C:
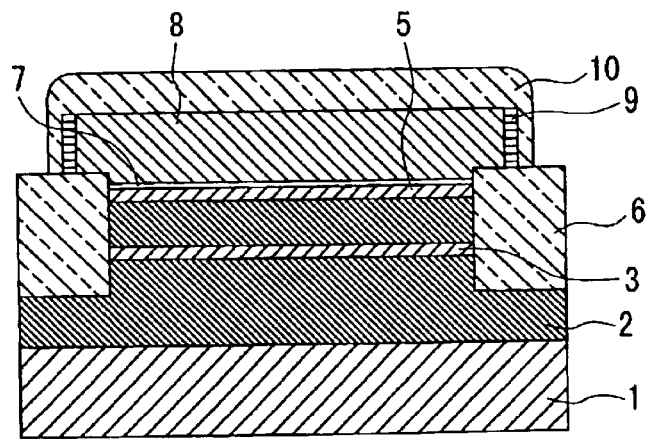
FIG. 5C is a sectional view taken on line B–B' in FIG. 5A.
Figure 6A:
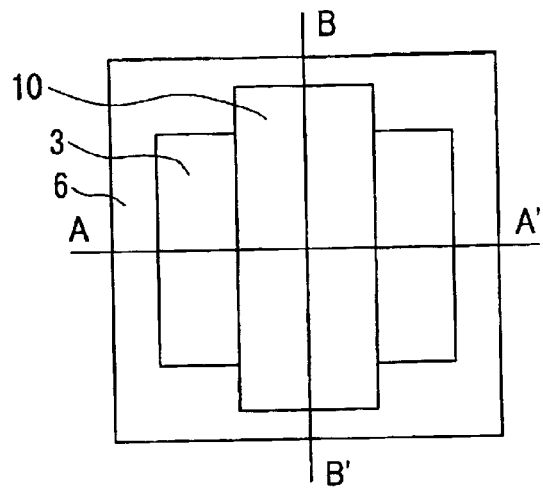
FIG. 6A is a plan view for illustrating the principal part of the device according to Embodiment 1 of the invention, in the order of the steps of fabrication.

Subsequently, as shown in FIG. 6, the strain-relaxed silicon germanium layer 4 only is selectively etched. For an etching solution, use is made of an etchant prepared by mixing ammonia, hydrogen peroxide, and water together at a ratio of 1:5:50. Since silicon germanium is etched at a higher rate as compared with strained silicon, a region where the strain-relaxed silicon germanium layer 4 has existed before is completely removed as shown in the figure, thereby forming a void 100. As shown in FIG. 5C showing the sectional view taken on line B–B' in 5A, both ends of the upper strained silicon layer 5, the gate insulator 7, the gate electrode 8, and the gate sidewalls 9, 10, respectively, are supported by the isolation region 6.

Figure 6B:
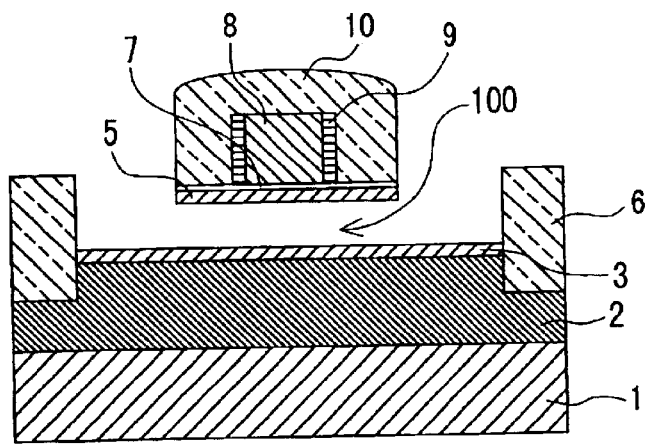
FIG. 6B is a sectional view taken on line A–A' in FIG. 6A.
Figure 6C:
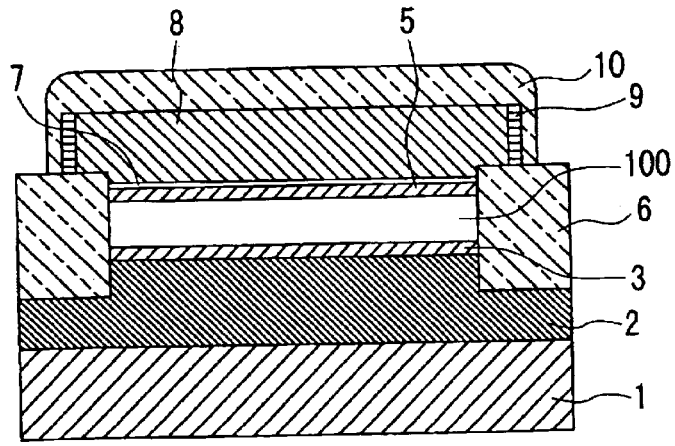
FIG. 6C is a sectional view taken on line B–B' in FIG. 6A.

With a device having a gate length not more than 0.3 μm, the silicon germanium layer underneath the gate electrode is completely removed as shown in FIGS. 6B, 6C, however, with a device having a gate length longer than 0.3 μm, a portion of the silicon germanium layer, underneath the central part of the gate electrode, is left out (such a state is not shown in the figures). Even if such a state exists, since portions of the silicon germanium layer, underneath portions of the strained silicon layer, close to the source and drain, respectively, are removed, there occurs no problem of a parasitic channel caused by carriers flowing into the silicon germanium layer. Because a gate length is long in the first place, there occurs no problem of the short channel effect.

Figure 7A:
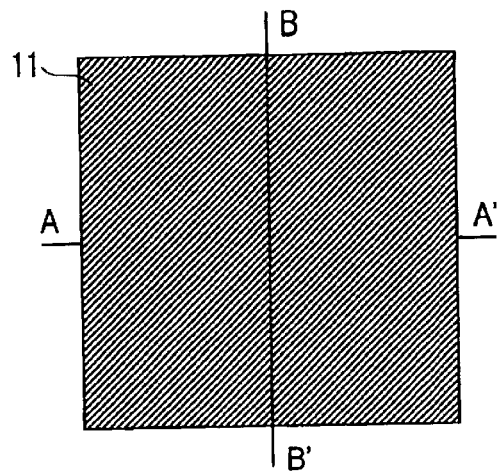
FIG. 7A is a plan view for illustrating the principal part of the device according to Embodiment 1 of the invention, in the order of the steps of fabrication.
Figure 7B:
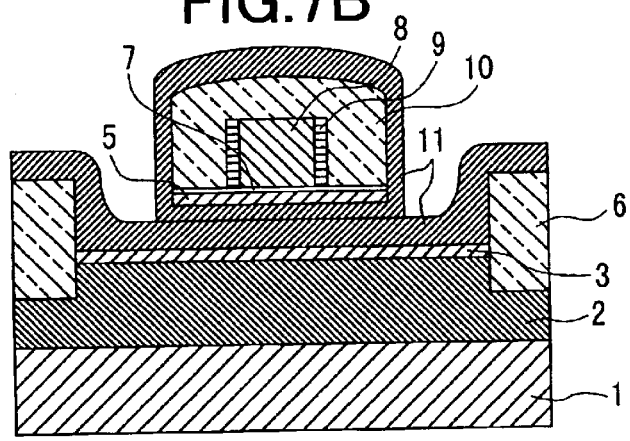
FIG. 7B is a sectional view taken on line A–A' in FIG. 7A.
Figure 7C:
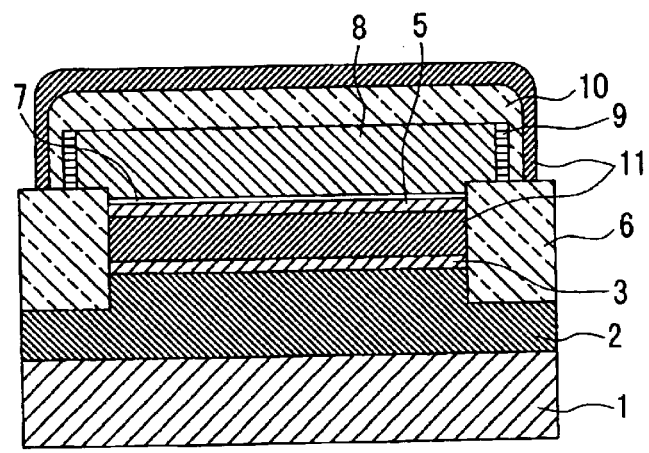
FIG. 7C is a sectional view taken on line B–B' in FIG. 7A.

Subsequently, as shown in FIG. 7, an embedded oxide film 11 is deposited in the void. The embedded oxide film 11 is formed to a thickness of 30 nm, for example, by the same method as that for the second gate sidewall 10.

Figure 8A:
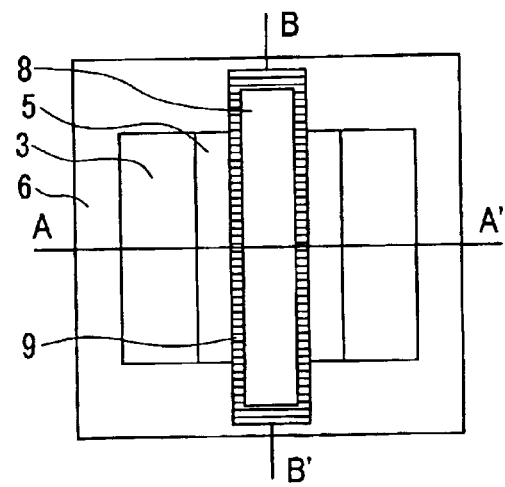
FIG. 8A is a plan view for illustrating the principal part of the device according to Embodiment 1 of the invention, in the order of the steps of fabrication.
Figure 8B:
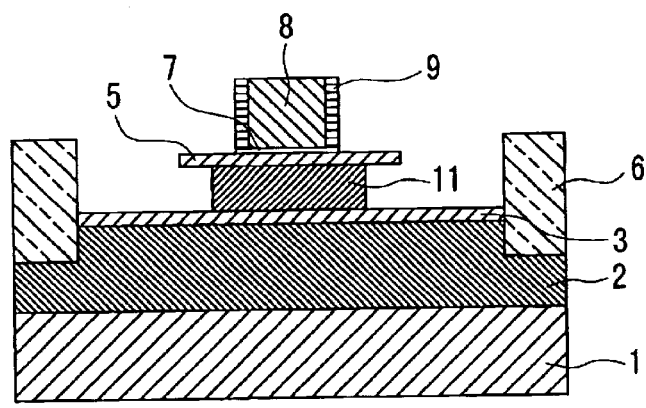
FIG. 8B is a sectional view taken on line A–A' in FIG. 8A.
Figure 8C:
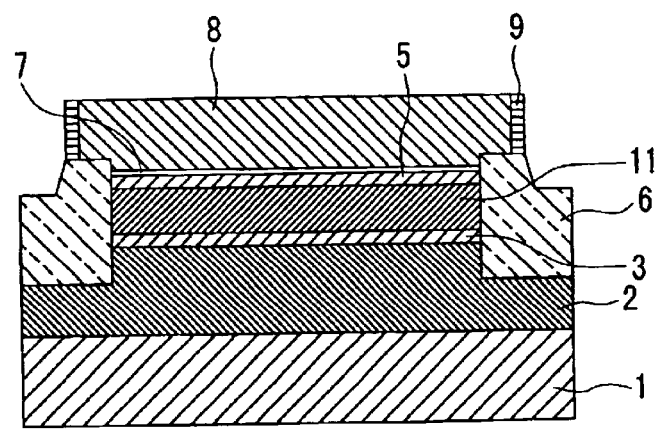
FIG. 8C is a sectional view taken on line B–B' in FIG. 8A.

Subsequently, as shown in FIG. 8, dry etching is applied to the embedded oxide film 11. Since it is dry etching that is applied, a portion of the embedded oxide film 11, directly underneath the gate electrode 8, is not etched away to be thereby left out. Further, as shown in the sectional view of FIG. 8C, portions of the isolation region 6 also are etched away.

Figure 9A:
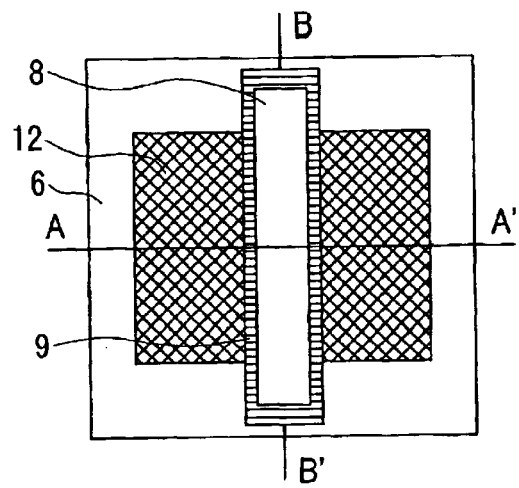
FIG. 9A is a plan view for illustrating the principal part of the device according to Embodiment 1 of the invention, in the order of the steps of fabrication.
Figure 9B:
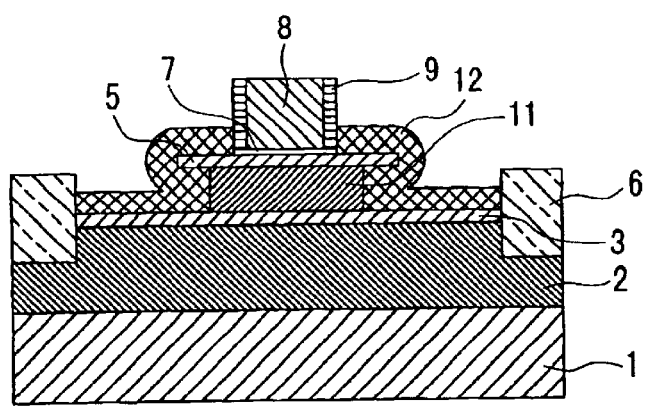
FIG. 9B is a sectional view taken on line A–A' in FIG. 9A.
Figure 9C:
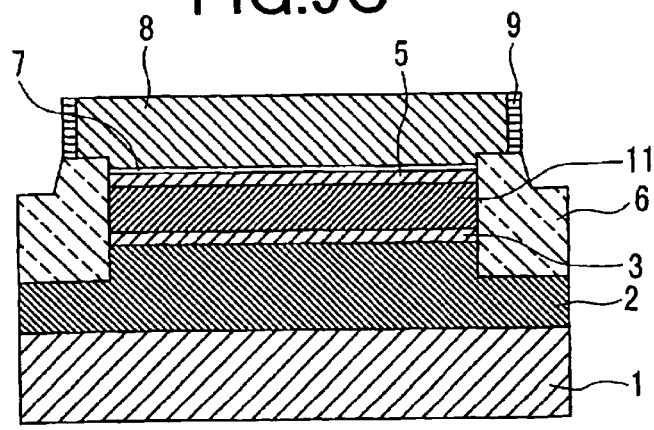
FIG. 9C is a sectional view taken on line B–B' in FIG. 9A.

Next, as shown in FIG. 9, a silicon film is deposited to a thickness 30 nm, for example, in source and drain regions 12, respectively, by a CVD method. After deposition of the film, impurity ions are implanted into the source and drain regions 12. It is well known that different impurities can be implanted into p-type and n-type regions, respectively, by an ion implantation method, thereby enabling a CMOS circuit to be formed with ease. Further, doping of the source and drain with an impurity may be done by mixing a doping gas at the time of the growth of the film by the CVD method.

The present embodiment is structured such that the source and drain are formed on a common bulk substrate, and a channel portion only is of an SOI structure. Accordingly, electrical contact can be easily obtained between the substrate and the source and drain, respectively, so that there does not occur the floating-body effect unique to a SOI transistor.

Thereafter, in accordance with a process of fabricating a CMOS, well known to those skilled in the art, respective steps of forming an interlayer insulator, forming contact holes, and forming wiring are repeated to thereby complete a transistor integrated circuit.

Embodiment 2

Embodiment 2 differs from Embodiment 1 in that use of an SOI substrate is substituted for use of the substrate according to Embodiment 1.

Figure 10:
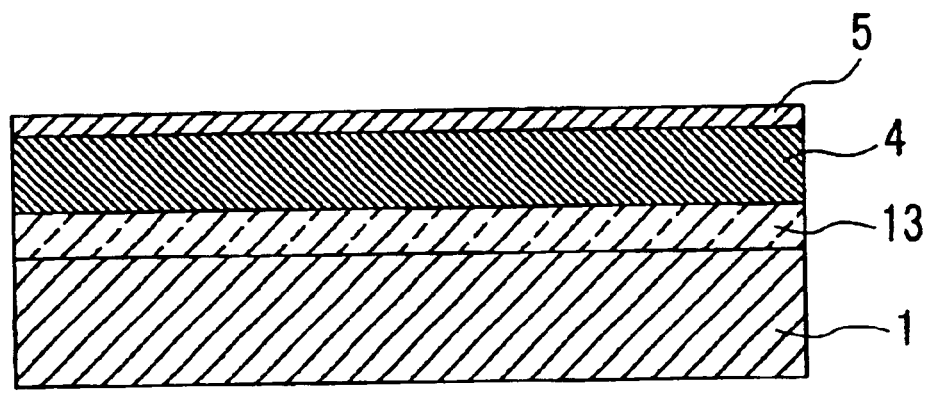
FIG. 10 is a sectional view of a stacked structure wherein an embedded insulating film, a strain-relaxed silicon germanium layer, and a strained silicon layer are deposited in that order on a silicon substrate, to be used in carrying out Embodiment 2 of the invention.

The SOI substrate has a structure, as shown in a sectional view of FIG. 10, wherein an embedded insulating film 13, a strain-relaxed silicon germanium layer 4, and a strained silicon layer 5 are combined in that order on a silicon substrate 1. The silicon substrate 1 is intended only to support those film deposited thereon, and may be made of, for example, quartz, an inorganic oxide ceramic, and so forth, other than silicon.

Figure 11A:
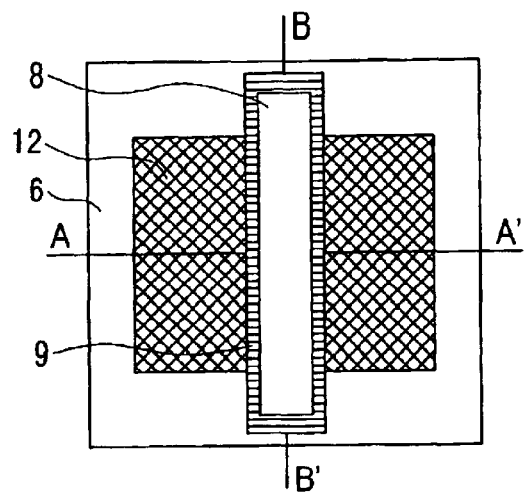
FIG. 11A is a plan view for illustrating the principal part of a device according to Embodiment 2 of the invention, in the order of steps of fabrication.
Figure 11B:
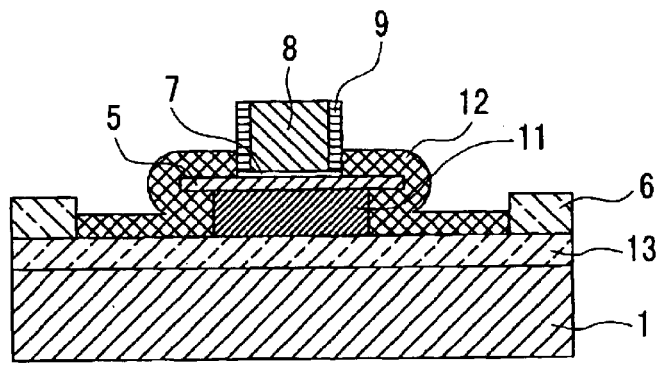
FIG. 11B is a sectional view taken on line A–A' in FIG. 11A.
Figure 11C:
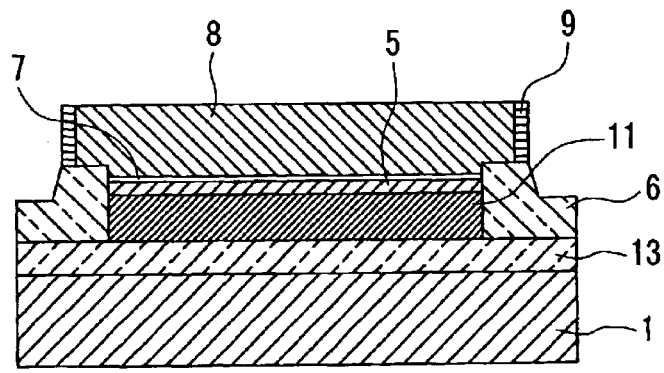
FIG. 11C is a sectional view taken on line B–B' in FIG. 11A.

With the present embodiment, although the substrate is changed, other steps of a fabrication method can be executed in the same way as those for Embodiment 1. Further, the etching of the silicon germanium layer 4 according to Embodiment 1, as shown with reference to FIG. 6, is stopped at the embedded insulating film 13. Since etch selectivity of silicon germanium to an oxide film is higher than that of silicon germanium to silicon, conditions concerning etch selectivity can be eased as compared with the case of Embodiment 1. Further, the etching of the oxide film according to Embodiment 1, as shown with reference to FIG. 8, can be satisfactorily executed by controlling an etch amount so as not to remove the embedded insulating film 13. FIG. 11 shows a state after formation of a source and drain, corresponding to that according to Embodiment 1, as shown in FIG. 9. FIG. 11A is a plan view, FIG. 11B is a sectional view taken on line A–A' in FIG. 11A, and FIG. 11C is a sectional view taken on line B–B' in FIG. 11A.

Embodiment 3

Embodiment 3 is concerned with a transistor having strained silicon channels of a fin-shaped structure.

Figure 12:
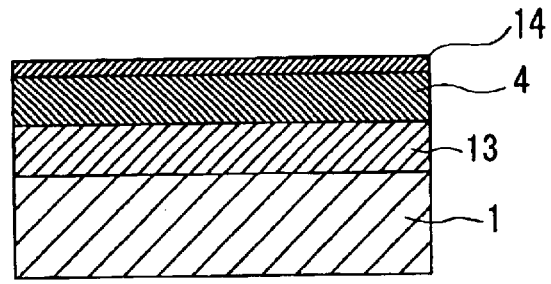
FIG. 12 is a sectional view of a strain-relaxed silicon germanium on an insulator layer on a substrate for use in carrying out Embodiment 3 of the invention.
Figure 24:
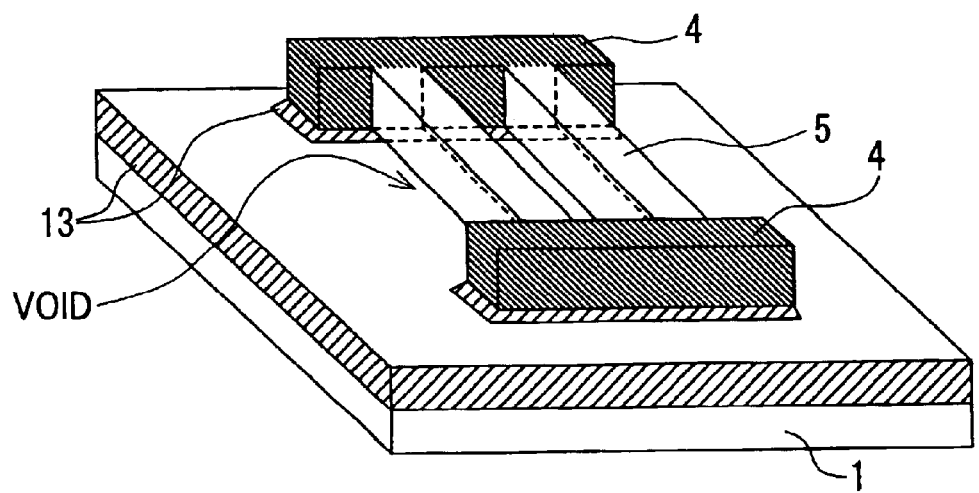
FIG. 24 is a perspective view showing a state of Embodiment 3, wherein the respective fins of the strained silicon layer 5 are in the form of a bridge supported by the strain-relaxed silicon germanium layer.
Figure 27A:
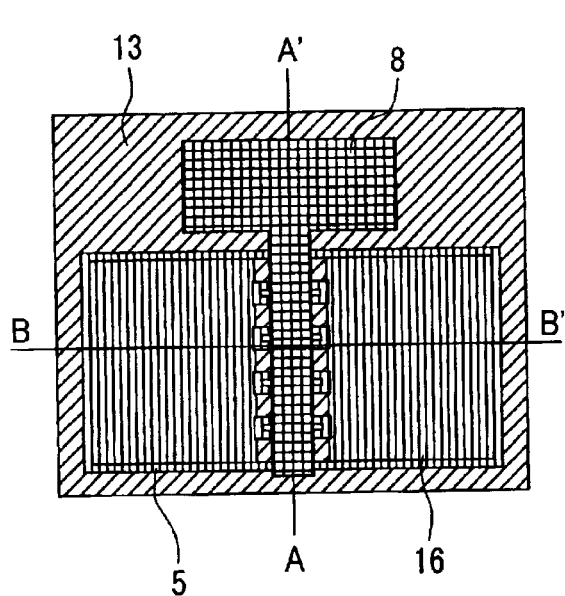
FIG. 27A is a plan view for illustrating the principal part of the device according to Embodiment 3 of the invention, in the order of the steps of fabrication.
Figure 27B:
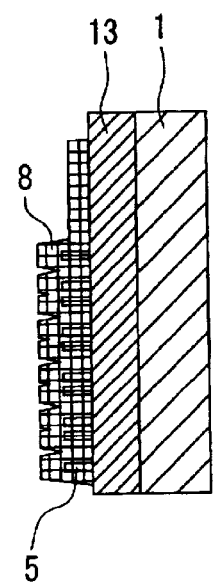
FIG. 27B is a sectional view taken on line A–A' in FIG. 27A.
Figure 27C:
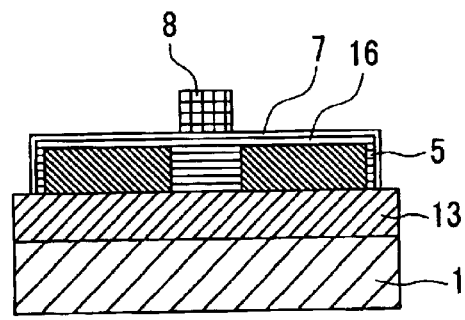
FIG. 27C is a sectional view taken on line B–B' in FIG. 27A.
Figure 28:
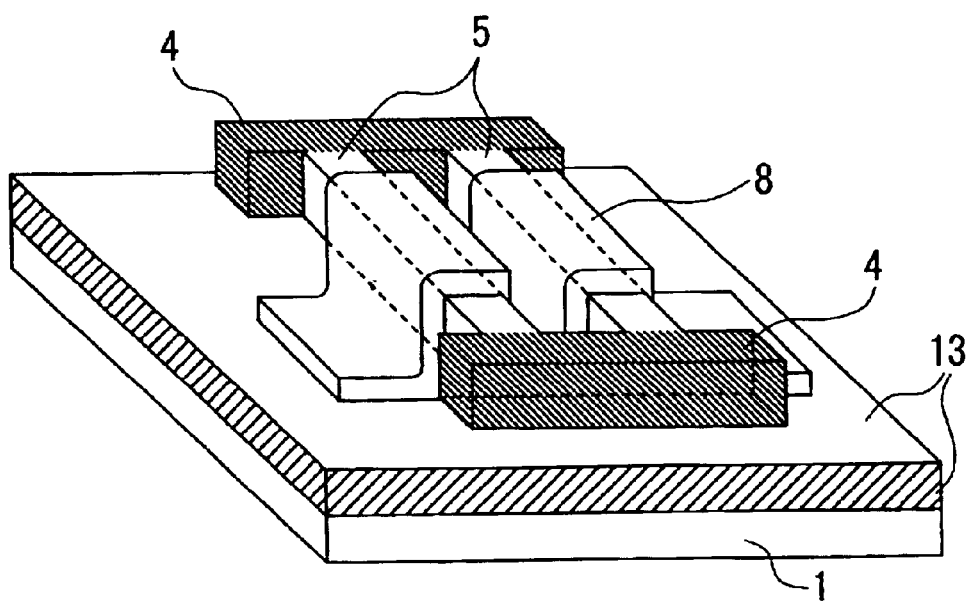
FIG. 28 is a perspective view of Embodiment 3, showing fin-shaped strained silicon channels, silicon germanium layers placed at opposite ends thereof, and shapes of gate electrodes.

FIG. 12 is a sectional view of a substrate according to the present embodiment. FIGS. 13 and 14 and FIGS. 19 through 29 are schematic illustrations of a device in a fabrication process according to the present embodiment. Suffix "A" of the respective figures indicates a plan view of the device, suffix "B" a sectional view taken on line A–A' of the respective figures with A, and suffix "C" a sectional view taken on line B–B' of the respective figures with suffice "A". FIGS. 24 and 28 are perspective views of the device in the fabrication process.

Figure 15:
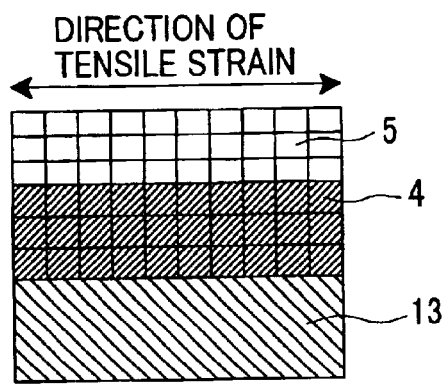
FIG. 15 shows a schematic cross-section for illustrating deformation of a crystal lattice, occurring in a case of a strained silicon layer being caused to grow on the top surface of a strain-relaxed silicon germanium layer.
Figure 16:
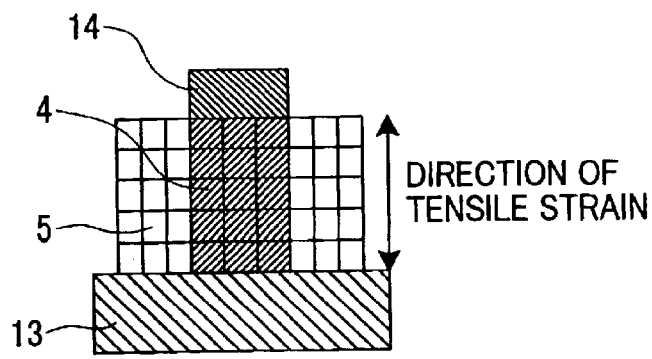
FIG. 16 shows a schematic cross-section for illustrating deformation of a crystal lattice, occurring in another case of the strained silicon layer being caused to grow on the side surface of the strain-relaxed silicon germanium layer.
Figure 17:
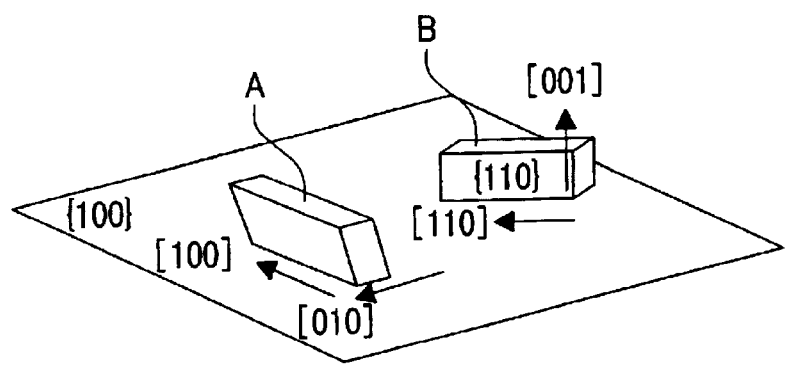
FIG. 17 is a schematic view showing directions in which fins are placed on a (100)-faced substrate.
Figure 18:
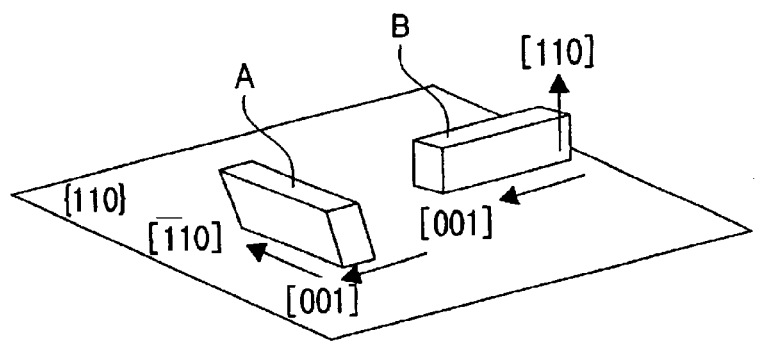
FIG. 18 is another schematic view showing directions in which the fins are placed on the (110)-faced substrate.

FIGS. 15 through 18 are schematic views for illustrating features of a strained silicon layer. FIGS. 15 and 16 are sectional views showing the direction of tensile strain by way of example when a strained silicon layer 5 is grown on a silicon germanium layer 4 while FIGS. 17 and 18 are perspective views showing a relationship between the direction of crystal plane of a substrate on which a fin-shaped silicon layer is grown and the longitudinal direction of the fin-shaped silicon layer.

A strain-relaxed silicon germanium on an insulator substrate (hereinafter referred to as an SGOI substrate), structured as shown in FIG. 12, is prepared. For example, on top of a support substrate 1, there are deposited an embedded insulating film 13 to a thickness 100 nm, a strain-relaxed silicon germanium layer 4 to a thickness 100 nm, and a surface oxide film layer 14 to a thickness 10 nm, in that order. With the present embodiment, the support substrate 1 is a silicon substrate 1; however, the support substrate 1 is not limited to the silicon substrate.

Figure 13A:
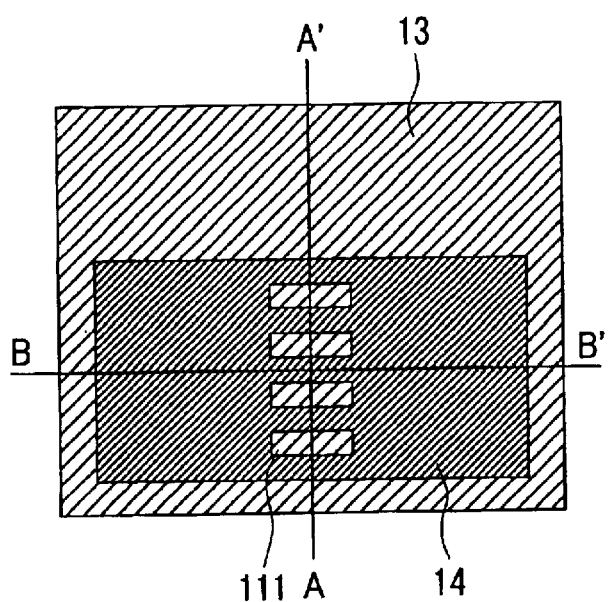
FIG. 13A is a plan view for illustrating the principal part of a device according to Embodiment 3 of the invention, in the order of steps of fabrication.
Figure 13B:
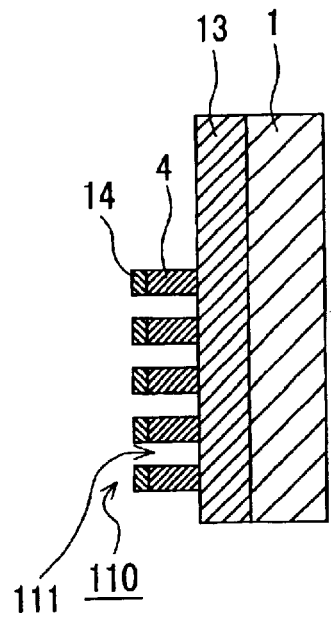
FIG. 13B is a sectional view taken on line A–A' in FIG. 13A.
Figure 13C:
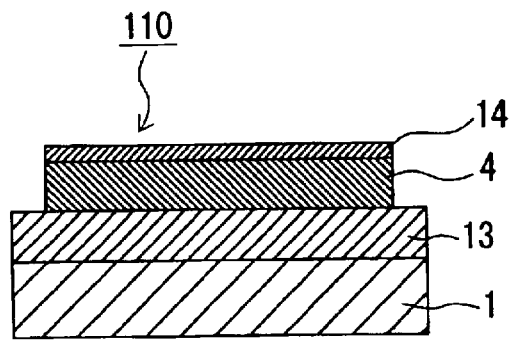
FIG. 13C is a sectional view taken on line B–B' in FIG. 13A.

As shown FIG. 13, an island-like region 110, made of the strain-relaxed silicon germanium layer 4 and the surface oxide film layer 14, is formed by dry etching. At this point, openings 111 are defined inside the island-like region 110. Such etching is stopped upon reaching the embedded insulating film 13.

Figure 14A:
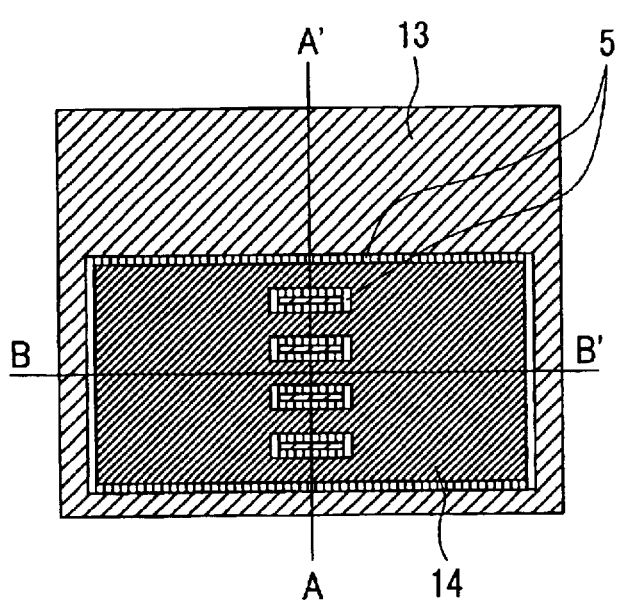
FIG. 14A is a plan view for illustrating the principal part of the device according to Embodiment 3 of the invention, in the order of the steps of fabrication.
Figure 14B:
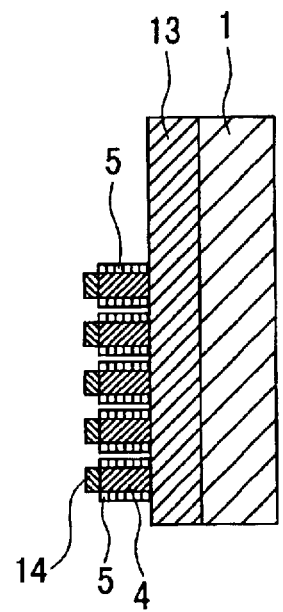
FIG. 14B is a sectional view taken on line A–A' in FIG. 14A.
Figure 14C:
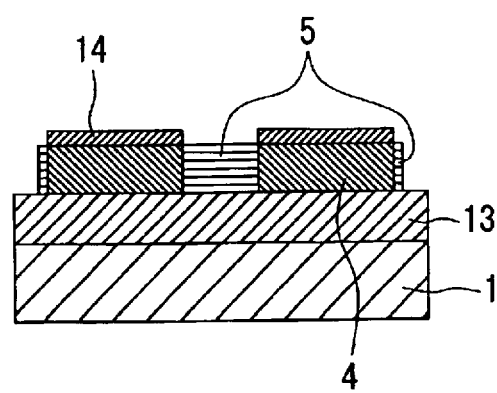
FIG. 14C is a sectional view taken on line B–B' in FIG. 14A.

Subsequently, as shown in FIG. 14, selective epitaxial growth of a strained silicon layer 5 to a thickness of, for example, 20 nm is done. By use of a low pressure CVD method, it is possible to grow silicon only at the sides of the strain-relaxed silicon germanium layer 4.

Now, a direction in which strain is caused to occur to the silicon layer is described hereinafter with reference to a sectional view of FIGS. 15 and 16, respectively.

FIG. 15 is a sectional view showing a case where the strained silicon layer 5 is caused to grow on the top surface of the strain-relaxed silicon germanium layer 4. In FIGS. 15 and 16, only the respective layers above the strain-relaxed silicon germanium layer 4 are shown. In the figures, grid-like lines schematically represent a crystal lattice. Because the crystal lattice of silicon germanium is larger in size than that of silicon, there results in lattice mismatch. Accordingly, the silicon layer 5 tends to grow so as to match its crystal lattice size in the top surface of the strain-relaxed silicon germanium layer 4. As a result, the crystal lattice of the silicon layer 5 undergoes deformation so as to expand within the top surface (in the x-, and y-directions), and contract thicknesswise (in the z-direction) as shown in the figure. This represents the so-called strained state of strained silicon. It is well known that there occurs an increase in mobility of carriers flowing inside the top surface (within a plane of the x, and y axes) due to strain.

In contrast, in the case of FIG. 16 corresponding to the present embodiment, growth of the silicon layer 5 takes place at the sides. Accordingly, the crystal lattice of the strained silicon layer 5 expands in the direction of a film thickness (in the z-direction), and in the direction perpendicular to the plane of the figure, and contract in the direction of film growth, perpendicular to the sides. As described later, the direction of current flowing through the channel of a transistor is parallel with the direction perpendicular to the plane of the figure, subjected to tensile strain, and consequently, there occurs an increase in mobility of carriers flowing through the channel due to strain. In FIG. 16, only the respective layers above the embedded insulating film 13 are shown as those in FIG. 14.

Direction of crystal plane of the substrate and the longitudinal direction of respective fins can be selected as follows. First, in the case of a commonly used substrate with the direction of crystal plane (100), it is possible to implement two different cases as shown in FIG. 17, that is, a case where the longitudinal direction of a fin-shaped layer is parallel to a direction <100> (a silicon layer A) and a case where the same is parallel to a direction <110> (a silicon layer B). In FIG. 17, only the fin-shaped silicon layers A and B are individually shown on a face (100) by way example. With the former silicon layer A, strain of strained silicon is isotropically applied in the direction <100> (or may be in the direction <110> since both the directions are equivalent to each other in effect) and a flow direction of carriers in the channel is <100>. As a result, with the present embodiment, an advantageous effect of an increase in mobility by the agency of the strained silicon can be fully appreciated.

In contrast, in the latter case of the silicon layer B, that is, in the case where the fins are formed such that the longitudinal direction thereof is parallel to the direction <110>, strained silicon is subjected to tensile strain anisotropically applied to both the direction <110>, and a direction <001>. When transistors are fabricated under the same condition, the threshold voltages thereof undergoes a change, and accordingly, by concurrently fabricating both devices, the devices having the threshold voltages different from each other can be mixedly mounted with ease. Hence, such a configuration has a large advantage in designing circuitry enabling one device to serve, for example, as a high-performance device, and the other to serve as a low-power-consumption device.

In the case where the direction of the crystal plane of the substrate is (110), it is possible to implement two different cases as shown in FIG. 18, that is, a case where the longitudinal direction of a fin is rendered parallel to a direction <110> (a silicon layer A) and a case where the same is rendered parallel to a direction <001> (a silicon layer B). In FIG. 18, only the fin-shaped silicon layers A and B are individually shown on a face {110} by way example.

In the former case, the strain of the strained silicon is isotropically applied in the direction <100> (or may be the direction <110> since both the directions are equivalent), and the flow direction of carriers in the channel is <100>. Accordingly, with the present embodiment, it is possible to fully enjoy the advantageous effect of an increase in mobility by the agency of the strained silicon.

In contrast, in the latter case where the fin is formed such that the longitudinal direction thereof is in the direction <001>, strained silicon is subjected to tensile strain anisotropically applied to both the direction <110>, and the direction <001>. When transistors are fabricated under the same condition, the threshold voltages thereof undergoes a change, and accordingly, by concurrently fabricating both devices, the devices having the threshold voltages different from each other can be mixedly mounted with ease. The present embodiment has therefore a large advantage in designing circuitry enabling one device to serve, for example, as a high-performance device, and the other to serve as a low-power-consumption device.

Variations in index of the crystal plane and the longitudinal direction of the respective fins, as selected, are permissible within a range of approximately ±5 degrees although these vary depending on characteristics of requirements for a device and a device structure.

Now, reverting to the fabrication method, there are described hereinafter steps after formation of the strained silicon layer 5.

Figure 19A:
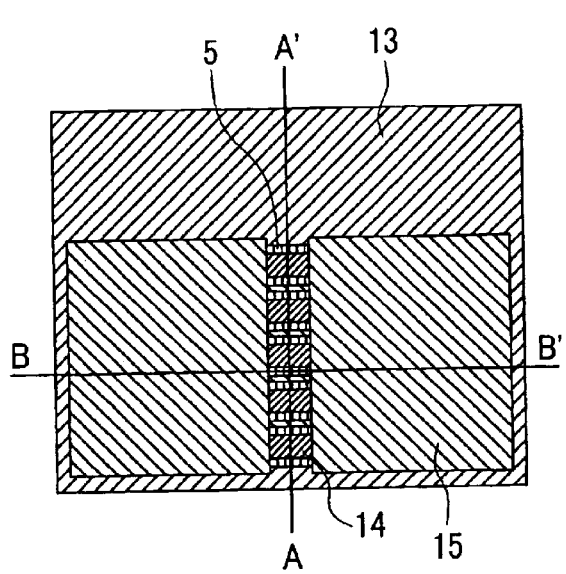
FIG. 19A is a plan view for illustrating the principal part of the device according to Embodiment 3 of the invention, in the order of the steps of fabrication.
Figure 19B:
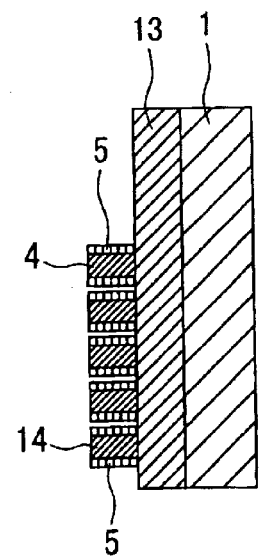
FIG. 19B is a sectional view taken on line A–A' in FIG. 19A.
Figure 19C:
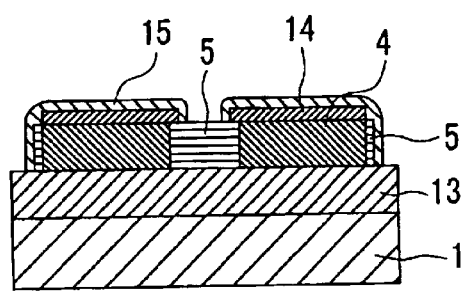
FIG. 19C is a sectional view taken on line B–B' in FIG. 19A.
Figure 20A:
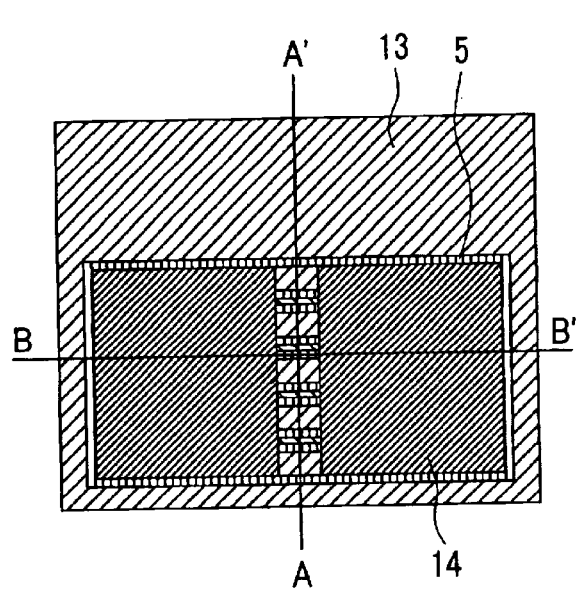
FIG. 20A is a plan view for illustrating the principal part of the device according to Embodiment 3 of the invention, in the order of the steps of fabrication.

As shown in FIG. 19, a resist mask 15 is formed on portions of the region of the SiGe layer, to be removed in a succeeding step, thereby peeling off portions of the surface oxide film layer 14. Further, as shown in FIG. 20, after peeling off the resist mask 15, the silicon germanium layer 4 is selectively etched by the same method as for Embodiment 1. In this case, portions of the silicon germanium layer 4, covered by the surface oxide film layer 14, are not removed.

Figure 20B:
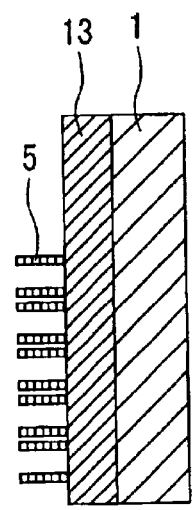
FIG. 20B is a sectional view taken on line A–A' in FIG. 20A.
Figure 20C:
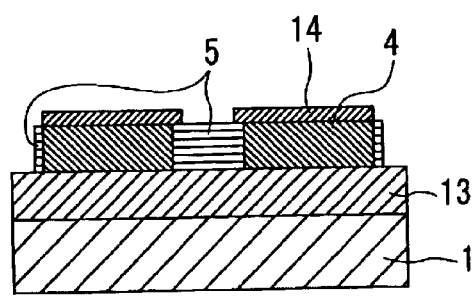
FIG. 20C is a sectional view taken on line B–B' in FIG. 20A.

As shown in FIG. 20B, the strained silicon layers 5 each in the shape of a fin are left out in this step. Referring to respective views of FIGS. 21 through 23, there is described hereinafter why the fins are held without turning over. In respective sectional views thereof, there are shown only respective layers above the embedded insulating film 13 as in FIG. 16. In the left-hand part of the respective sectional views, there is shown a sectional view of a state prior to growth of the strained silicon layer 5, and in the right-hand part of the respective sectional views, there is shown a sectional view of a state after the growth of the strained silicon layer 5 or a state after dry etching is applied thereafter.

Figure 21:
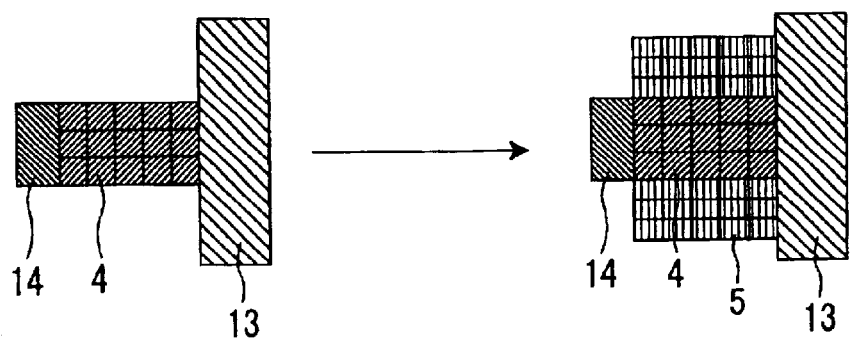
FIG. 21 is a sectional view showing a state of uniform growth of the strained silicon layer, taking place on sides of the fin of the strain-relaxed silicon germanium layer.
Figure 22:
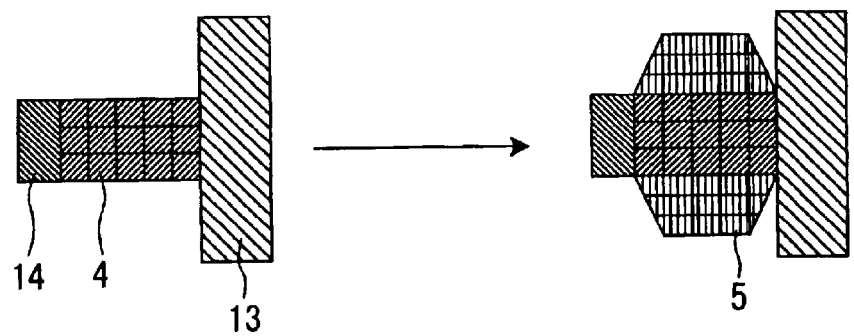
FIG. 22 is a sectional view showing a state of facet growth of the strained silicon layer, taking place on the fin of the strain-relaxed silicon germanium layer.
Figure 23:
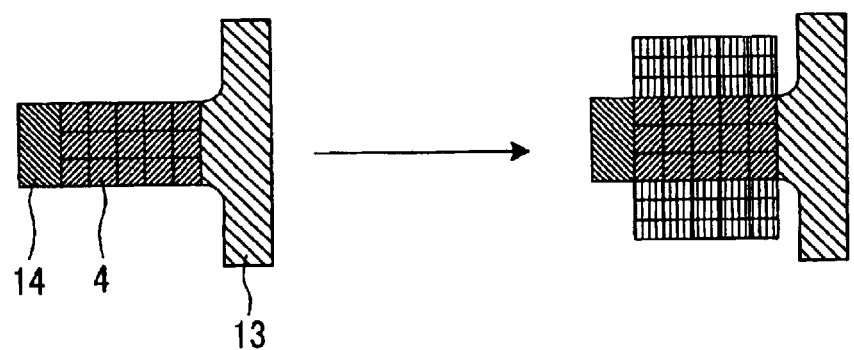
FIG. 23 is a sectional view showing a state of growth of the strained silicon layer, taking place on sides of the fin of the strain-relaxed silicon germanium layer.

FIG. 21 is a sectional view similar to FIG. 16. Upon uniform growth of the strained silicon layer 5 on the fin of the strain-relaxed silicon germanium layer 4 (in the left-hand part of FIG. 21), the fins of the strained silicon layer 5 are in a form contacting the embedded insulating film 13. Accordingly, the fins can be held without turning over. Such a state is shown in the right-hand part of FIG. 21.

Facet growth often occurs when carrying out selective epitaxial growth by CVD. In such a case, there can occur a case where the fins of the strained silicon layers 5 are parted from the embedded insulating film 13 as shown in the right-hand part of FIG. 22.

In the step of the dry etching as shown in FIG. 13, there often occurs over-etching reaching the embedded insulating film 13. As a result, as shown in the right-hand part of FIG. 23, the strained silicon layers 5 are parted from the embedded insulating film 13 in this case as well. However, even in a state where the strained silicon layers 5 are out of contact with the embedded insulating film 13 as described above, since, for example, the strained silicon layers 5 at both ends of the respective fins, in the longitudinal direction thereof, are in contact with the strain-relaxed silicon germanium layer 4, respectively, the fins in the form of a bridge, so to speak, can be held.

FIG. 24 shows a state of the strained silicon layers 5 floating as a result of the over-etching. FIG. 24 is a perspective view showing a state where the strained silicon layers 5 each in fin-like shape are formed above the embedded insulating film 13. Further, in this example, portions of the silicon germanium layer 4 are removed so as to leave out the strained silicon layers 5 each in fin-like shape, and due to the over-etching, a void 30 is formed between the respective strained silicon layers 5 and the embedded insulating film 13. In this case, however, both ends of the respective strained silicon layers 5 each in fin-like shape, in the longitudinal direction thereof, are supported and held by remaining portions of the silicon germanium layer 4.

Figure 25A:
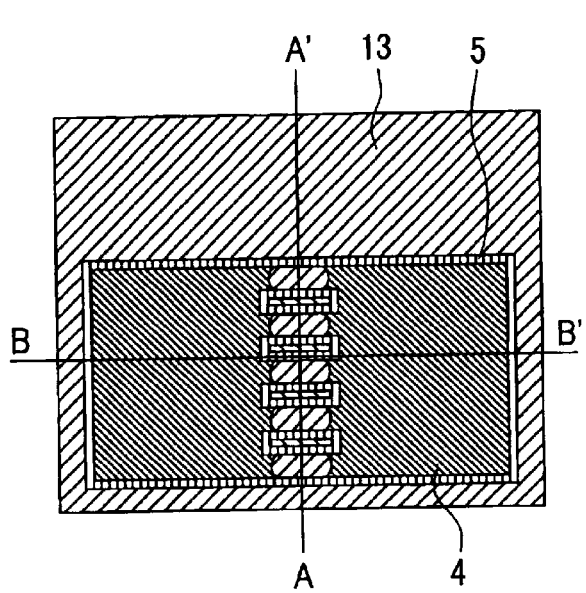
FIG. 25A is a plan view for illustrating the principal part of the device according to Embodiment 3 of the invention, in the order of the steps of fabrication.
Figure 25B:
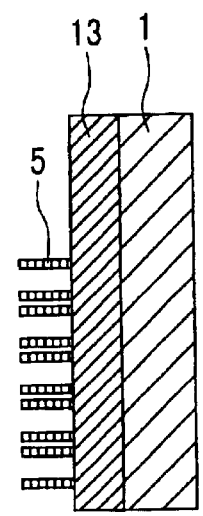
FIG. 25B is a sectional view taken on line A–A' in FIG. 25A.
Figure 25C:
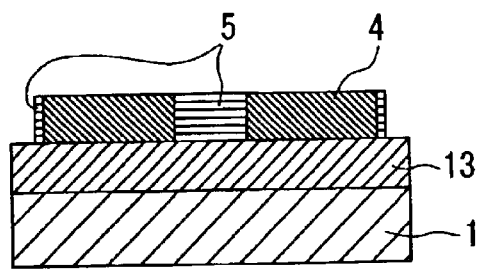
FIG. 25C is a sectional view taken on line B–B' in FIG. 25A.
Figure 26A:
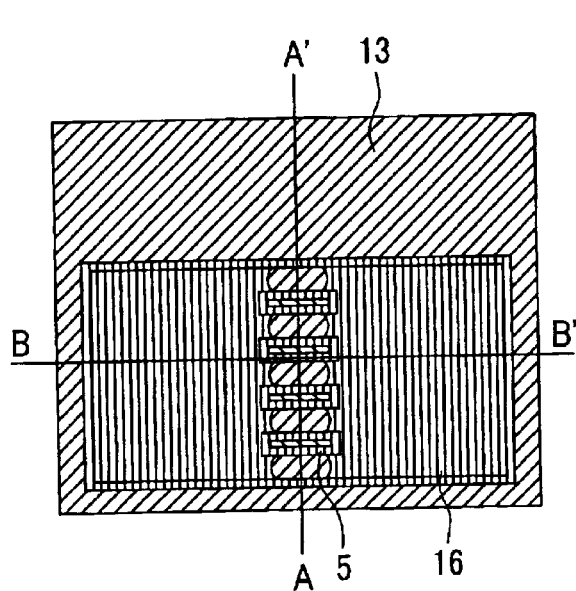
FIG. 26A is a plan view for illustrating the principal part of the device according to Embodiment 3 of the invention, in the order of the steps of fabrication.
Figure 26B:
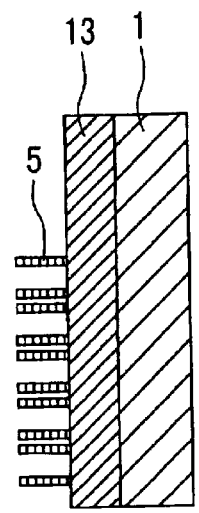
FIG. 26B is a sectional view taken on line A–A' in FIG. 26A.
Figure 26C:
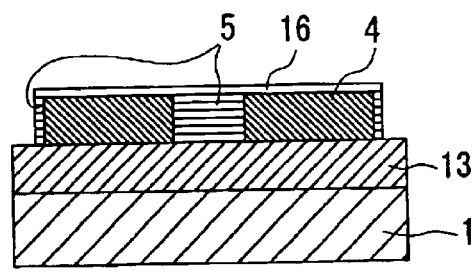
FIG. 26C is a sectional view taken on line B–B' in FIG. 26A.

Normally, the remaining portions of the silicon germanium layer 4 are each formed to a width larger than that of the respective strained silicon layers 5 each in fin-like shape. Now, reverting to the fabrication method again, portions of the surface oxide film layer 14, at opposite ends thereof, shown in FIG. 20, are removed by dry etching, resulting in a state as shown in FIG. 25. Subsequently, as shown in FIG. 26, a cap silicon layer 16 (5 nm) is deposited so as to cover exposed potions of the silicon germanium layer 4. The reason for doing this is because if the silicon germanium layer 4 without the cap silicon layer is subjected to oxidation in a succeeding step of gate oxidation, interface-state density of a gate insulator interface becomes high, causing deterioration in characteristics of a transistor.

Subsequently, a gate insulator 7 and a gate electrode film are formed by the well-known method (not shown). Further, by dry etching, gate electrodes 8 are worked into a desired shape, respectively, which are shown in FIG. 27. For the sake of clarity, FIG. 28 shows an arrangement of channels and gates in the case where there are formed two lengths of the fins. The strained silicon layers 5 each in fin-like shape are formed above the embedded insulating film 13. The both ends of the respective strained silicon layers 5 each in fin-like shape, in the longitudinal direction thereof, are supported by the silicon germanium layer 4, respectively. Respective gate electrodes 8 are placed so as to spread across the strained silicon layer 5 in fin-like shape, and the gate insulator 7 covering the strained silicon layer 5. A state of the respective gate electrodes 8 spreading across the strained silicon layer 5 in fin-like shape in this manner can be seen from the figure. Thus, it becomes possible to provide the channel on both sides of the strained silicon layer 5 in fin-like shape, thereby constituting the basic structure of an insulated-gate field-effect transistor of a double-gate structure. In this case, there is a form in which the channel is provided on the both sides only and a form in which the channel is also provided on top of the fin structure. The form in which the channel is also provided on top of the fin structure has an advantage of an increase in output current.

Figure 29A:
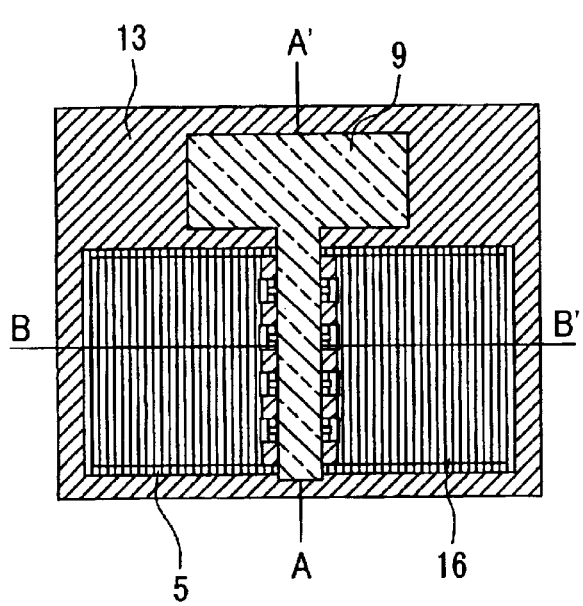
FIG. 29A is a plan view for illustrating the principal part of the device according to Embodiment 3 of the invention, in the order of the steps of fabrication.
Figure 29B:
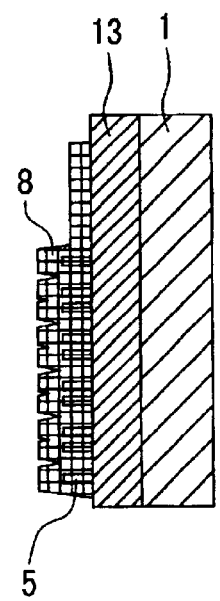
FIG. 29B is a sectional view taken on line A–A' in FIG. 29A.
Figure 29C:
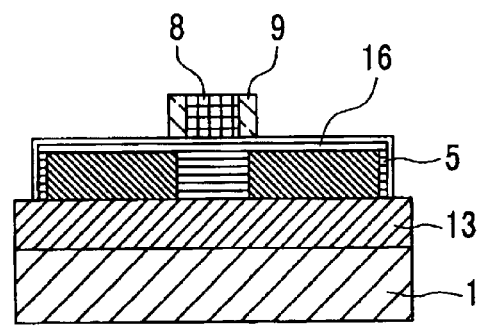
FIG. 29C is a sectional view taken on line B–B' in FIG. 29A.

Further, impurity ions are implanted into source/drain extension regions by the common method, thereby forming a gate sidewall 9 as shown in FIG. 29. Still further, impurity ions are implanted into source/drain regions 12 by the well-known method. Thus, the source and drain are formed on opposite sides of the gate and gate sidewall 9, respectively.

Further, in the steps of fabricating a semiconductor device, such as in the steps of forming interlayer insulator, forming contact holes, and forming wiring, normal respective processes are repeated to thereby complete a transistor integrated circuit.

Embodiment 4

Embodiment 4 is concerned with fabrication of a transistor having fin-shaped strained silicon channels similar to the case of Embodiment 3. The present embodiment, however, differs from Embodiment 3 in that a silicon germanium layer 4 is left underneath a channel layer.

With the present embodiment, selective etching of the silicon germanium layer 4 is omitted unlike in the step of Embodiment 3, shown in FIG. 20. In practice, if regions not to be etched are formed by providing a mask, elements according to the present embodiment can be formed in those regions while the same elements as those for Embodiment 3 are formed in other regions. Further, all other steps are completely same as those for Embodiment 3.

With Embodiment 3, two lengths of the fins of the strained silicon layer 5 are formed on opposite sides of one length of the fin of the silicon germanium layer 4. In addition, since the gate is formed on both faces of the respective strained silicon layers 5, respectively, there are formed four channels in total against the two lengths of the fins formed by use of one length of the silicon germanium layer 4.

In contrast, with the present embodiment, the strained silicon layer 5 is formed on both sides of the silicon germanium layer 4. Further, the gate electrode is formed so as to cover three layers: strained silicon layer 5, silicon germanium layer 4, and strained silicon layer 5. A channel is formed only outside of the strained silicon layers 5 on both sides of the silicon germanium layer 4. Accordingly, with the present embodiment, the number of channels is halved in comparison with that for Embodiment 3.

Accordingly, the present embodiment is at disadvantage in terms of current drive capacity of a transistor as compared with Embodiment 3. Further, since the silicon germanium layer is included in the vicinity of the channel, the present embodiment is inferior to Embodiment 3 in terms of short channel characteristics. However, assuming that the present embodiment has a primary object of application in a region where a gate length is 0.3 $\mu$m and longer, such a disadvantage poses no problem. It is possible to properly fabricate by the same process the device according to Embodiment 3 for a device with a short gate length and high performance, and a device according to the present embodiment for a device with a long gate length and without requirement for high performance. Hence, the present embodiment is advantageous in that these devices can be formed on the same chip.

Embodiment 5

The present embodiment represents a case of using a substrate on which a strain-relaxed silicon germanium layer 4 and a surface oxide film layer 14 are pre-formed in the shape of islands for a substrate of a device, having a fin-shaped structure.

Figure 30:
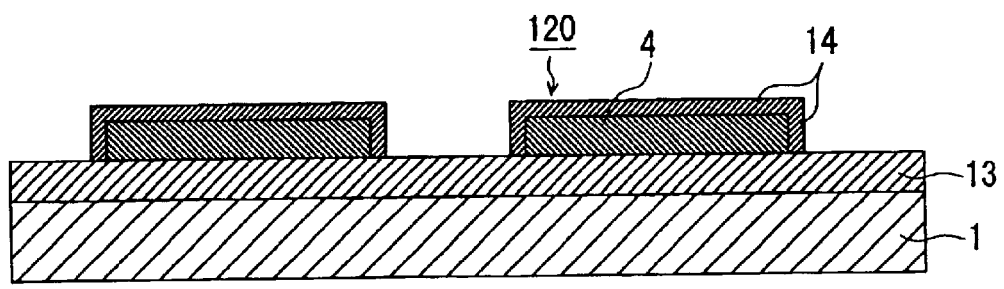
FIG. 30 is a sectional view of a substrate on which a strain-relaxed silicon germanium layer in the shape of islands is formed, for use in carrying out Embodiment 5.

With Embodiment 3 as previously described, use is made of the substrate on which the strain-relaxed silicon germanium layer 4 and surface oxide film layer 14 are formed on the entire surface thereof. The present embodiment differs from Embodiment 3 in respect of selection of the substrate. FIG. 30 is a sectional view of the substrate according to the present embodiment. Respective layers of the substrate have the same thickness as that for those of Embodiment 3. Referring now to the drawings, like reference numerals designate like or corresponding parts throughout the several views previously shown.

Figure 31A:
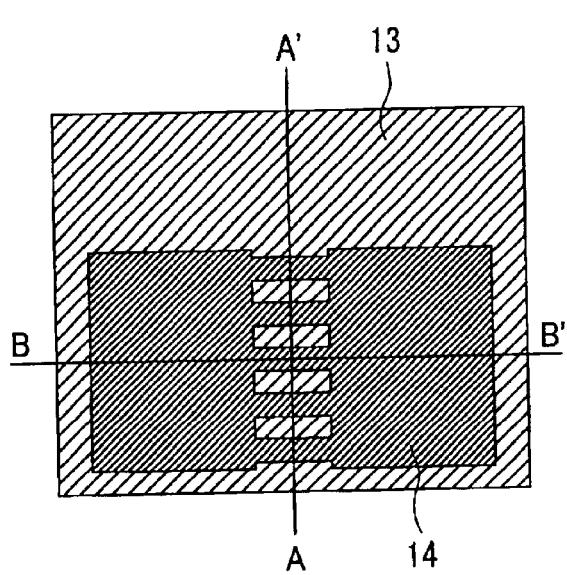
FIG. 31A is a plan view for illustrating the principal part of a device according to Embodiment 5 of the invention, after steps of fabrication, corresponding to that shown in FIG. 13.
Figure 31B:
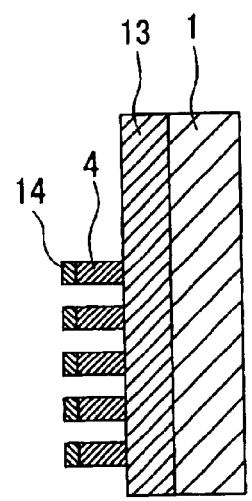
FIG. 31B is a sectional view taken on line A–A' in FIG. 31A.
Figure 31C:
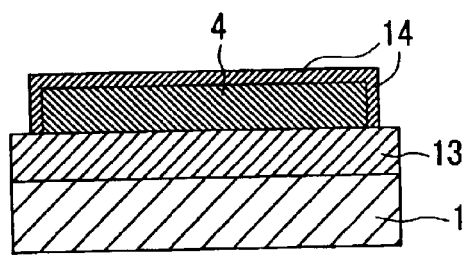
FIG. 31C is a sectional view taken on line B–B' in FIG. 31A.

The present embodiment differs from Embodiment 3 in that a surface oxide film layer 14 is also formed on the edge face of an island-like region 120. Accordingly, as shown in FIG. 31, in the step of etching, similar to that shown in FIG. 13, after etching the edge as well of the island-like region 120, the device can be fabricated by taking the same subsequent steps as those for Embodiment 3 or 4. FIG. 31A is a plan view of the device, FIG. 31B is a sectional view taken on line A–A' in FIG. 31A, and FIG. 31C is a sectional view taken on line B–B' in FIG. 31A.

Embodiment 6

Embodiment 6 provides another method of fabricating the substrate for use in carrying out Embodiments 2 through 5, respectively. FIG. 32A is a plan view of the substrate, FIG. 32B is a sectional view taken on line A–A' in FIG. 32A, and FIG. 32C is a sectional view taken on line B–B' in FIG. 32A. FIGS. 33 through 42 are sectional views of a device showing respective fabrication steps according to the present embodiment.

An oxide film 13 (to serve as an embedded insulating film 13) is formed to a thickness of, for example, 150 nm on the surface of a conventional substrate 1. Subsequently, as shown in FIG. 32, openings 121 are defined in the oxide film 13 by dry etching using a resist mask.

Subsequently, as shown in FIG. 33, ion implantation 26 is carried out through open parts 25. Although the resist mask is not shown in the figure, the ion implantation 26 may be carried out with the resist mask kept intact following the step of the dry etching. With the present embodiment, germanium ions are implanted, however, use may be made of other ions such as ions of phosphorus, arsenic, antimony, boron, and so forth, so as to enable the same to double as ions for controlling a conductivity type. Otherwise, argon, hydrogen, or oxygen may be implanted. Further, with the present embodiment, ion implantation is made to a depth 100 nm; however, there is no particular limitation thereto. Then, an implantation-damaged region 17 is formed.

Figure 34:
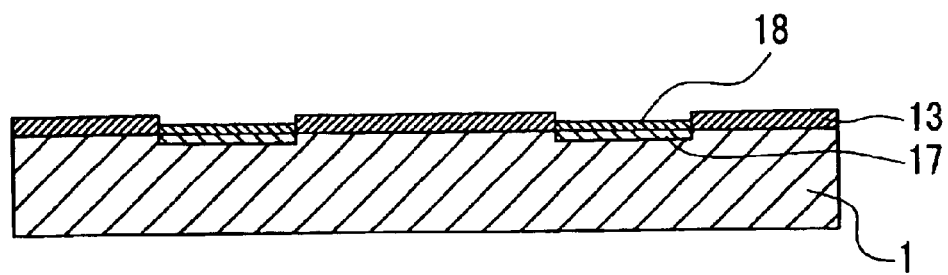
FIG. 34 is a sectional view for illustrating the principal part of the device according to Embodiment 6 of the invention, in the order of the steps of fabrication.

Subsequently, after removing the resist mask by the common method, and cleaning the surface of the substrate, selective epitaxial growth of a strain-relaxed silicon germanium seed layer 18 is caused to occur as shown in FIG. 34. The selective epitaxial growth of the strain-relaxed silicon-germanium seed layer 18 is implemented by a CVD method using dichlorosilane gas and germane gas as a feed material. Because of presence of the implantation-damaged region 17, strain due to misfit with the substrate 1 is sufficiently relaxed even with a film thickness of, for example, 100 nm in the case of the present embodiment, enabling the selective epitaxial growth to be maintained.

Figure 35:
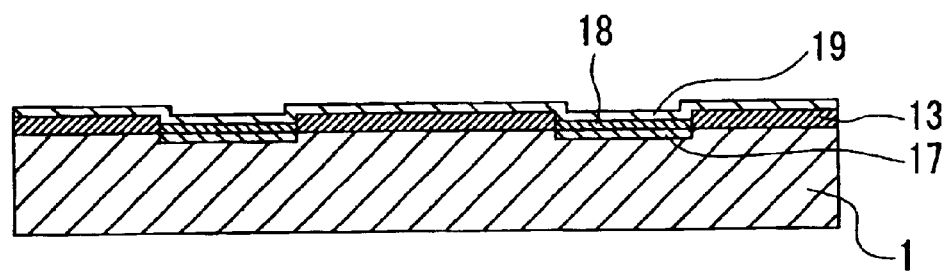
FIG. 35 is a sectional view for illustrating the principal part of the device according to Embodiment 6 of the invention, in the order of the steps of fabrication.
Figure 36:
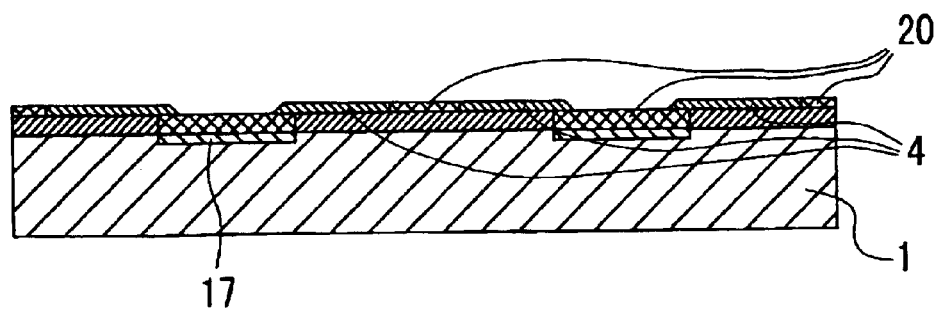
FIG. 36 is a sectional view for illustrating the principal part of the device according to Embodiment 6 of the invention, in the order of the steps of fabrication.

Subsequently, as shown in FIG. 35, an amorphous silicon germanium film 19 is deposited throughout the surface of the substrate 1. By use of a plasma CVD method using dichlorosilane gas and germane gas as a feed material, growth of the amorphous film is caused to occur at a relatively low substrate temperature of 350° C. Thereafter, the substrate 1 is subjected to heat treatment at 650° C. in an inert gas atmosphere for 20 minutes, thereby causing the amorphous silicon germanium film 19 to undergo solid phase crystallization. At this point, a portion of a silicon germanium film, on top of the implantation-damaged region 17, contains a defect, and the solid phase crystallization starts from above the implantation-damaged region 17, crystal growth proceeding laterally on top of the oxide (insulating) film 13. Accordingly, crystallizations proceeding from opposite sides come to meet each other at a midpoint portion, so that grain boundaries are formed at that portion. In FIG. 36, defective and grain boundary portions 20 are shown. There is formed a strain-relaxed silicon germanium layer 4 of single crystal and excellent crystal quality on portions of the insulating film 13, other than the defective and grain boundary portions 20.

Figure 37:
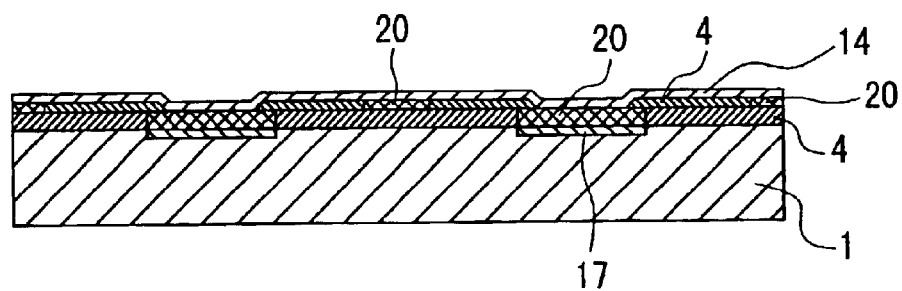
FIG. 37 is a sectional view for illustrating the principal part of the device according to Embodiment 6 of the invention, in the order of the steps of fabrication.
Figure 38:
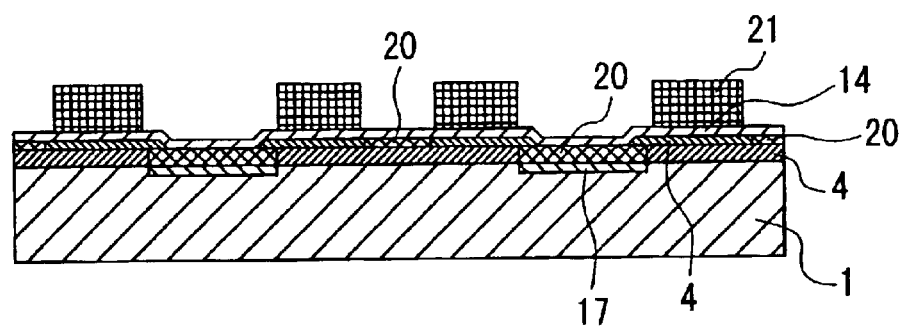
FIG. 38 is a sectional view for illustrating the principal part of the device according to Embodiment 6 of the invention, in the order of the steps of fabrication.
Figure 39:
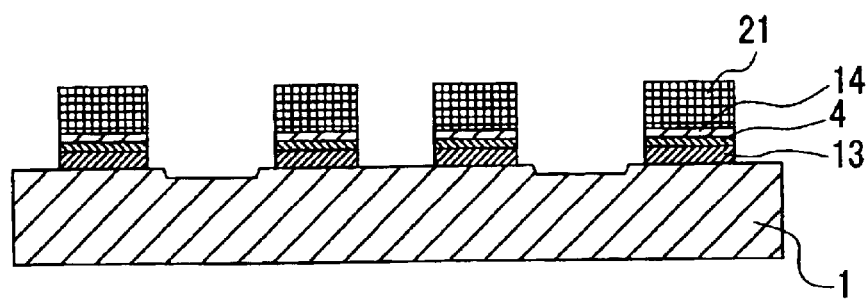
FIG. 39 is a sectional view for illustrating the principal part of the device according to Embodiment 6 of the invention, in the order of the steps of fabrication.

Thereafter, as shown FIG. 37, a surface oxide film 14 is formed to a thickness of, for example, 10 nm on the entire surface of the substrate 1 by a CVD method. Further, as shown FIG. 38, a mask 21 is formed, and as shown FIG. 39, there are removed by dry etching the surface oxide film 14, the strain-relaxed silicon germanium layer 4, and the implantation-damaged region 17, in regions including the defective and grain boundary portions 20 and the implantation-damaged region 17.

Figure 40:
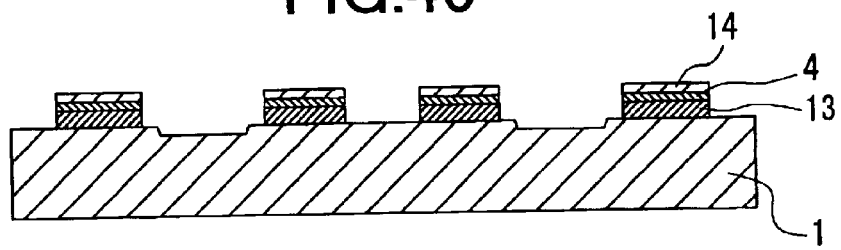
FIG. 40 is a sectional view for illustrating the principal part of the device according to Embodiment 6 of the invention, in the order of the steps of fabrication.

Upon removal of the mask 21, there is completed a stacked structure on top the substrate 1, made up of the embedded insulating film 13, the strain-relaxed silicon germanium layer 4, and the surface oxide film layer 14, patterned in the shape of islands, as shown in FIG. 40.

Figure 41:
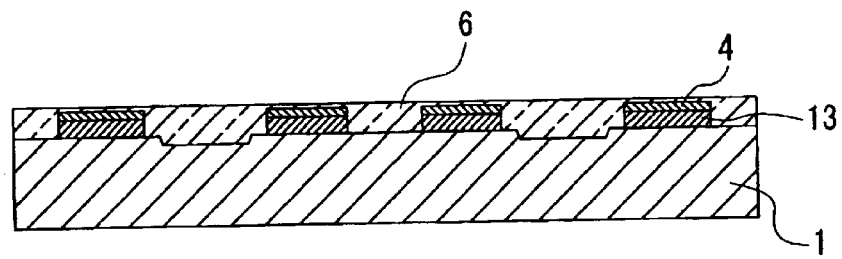
FIG. 41 is a sectional view for illustrating the principal part of the device according to Embodiment 6 of the invention, in the order of the steps of fabrication.

Further, after embedding an insulating film 6 made up of silicon dioxide ($SiO_2$) in regions where the respective films and so forth are removed by the dry etching with the use of a process such as, for example, a high-density plasma (HDP) CVD method, planarization treatment is applied thereto by chemical mechanical polishing (CMP) and so forth. By so doing, as shown in FIG. 41, there is brought into being a state where shallow trench isolations (STI) are formed. Further, after peeling off the surface oxide film layer 14 on top of the strain-relaxed silicon germanium layer 4, selective epitaxial growth of a strained silicon layer 5 is done in respective regions where the surface oxide film layer 14 has been peeled off, thereby forming a structure shown in FIG. 42. This state corresponds exactly to the state shown in FIG. 2. However, the present embodiment is structured such that the embedded insulating film 13 is substituted for the strained silicon layer 3, and the first strain-relaxed silicon germanium layer 2 does not exist as with the case of Embodiment 2.

In the subsequent steps of fabrication, the same device can be fabricated in the same way as with Embodiment 2. That is, with the present embodiment, the same device can be fabricated by use of a conventional substrate without use of the so-called SGOI substrate as shown in FIG. 10.

Figure 43:
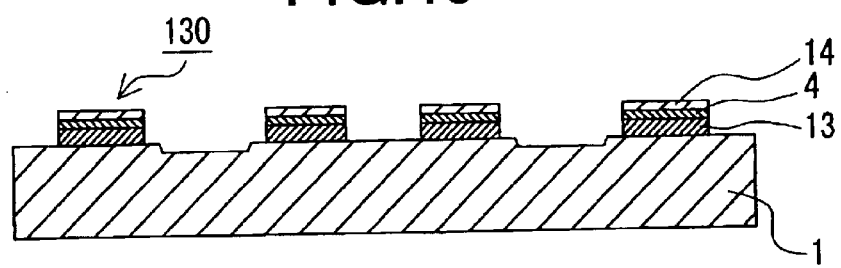
FIG. 43 is a sectional view for illustrating the principal part of the device according to Embodiment 6 of the invention, in the order of the steps of fabrication.
Figure 45:
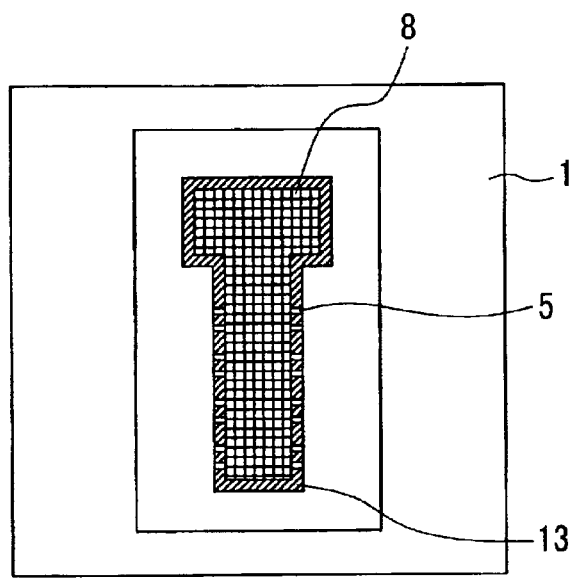
FIG. 45 is a plan view for illustrating the principal part of the device according to Embodiment 6 of the invention, in the order of the steps of fabrication.

Furthermore, it is also possible to fabricate a fin-shaped device from the substrate in a state shown in FIG. 40. FIGS. 43 through 45 are views showing such a variation. FIG. 43 is a sectional view corresponding to FIG. 40. FIGS. 44 and 45 are views for illustrating details of respective transistors formed on one substrate.

FIG. 44A is a plan view corresponding to FIG. 43. A sectional view, taken on line A–A' in FIG. 44A, is FIG. 43. FIG. 44B is a sectional view taken on line B–B' in FIG. 44A. As with Embodiment 3 described with reference to FIG. 13, openings (131, 132, 134, 135, and 136) are defined inside an island-like portion 130 as seen in FIG. 44A. In the lower part of FIG. 44A, the island-like portion 130 in FIG. 44A is shown after enlarged. Among the openings, there is included the opening 131, larger in size than openings 132, 134, 135 and 136, and in opening 131, a contact-forming region of a gate electrode 8, in the shape resembling the letter T, is formed. The gate electrode 8 is placed as shown FIG. 45. As a result, insulation between the gate electrode 8 and the substrate 1 is maintained with the embedded insulating film 13. Thereafter, the subsequent steps of fabrication can be carried out fully in the same way as with Embodiment 3 or 4. Thus, the present embodiment still has an advantage in that the same device can be fabricated by use of a common substrate without use of the so-called SGOI substrate as shown in FIG. 10.

Embodiment 7

Embodiment 7 provides still another method of fabricating a substrate, partially differing from that according to Embodiment 6. With the present embodiment, the ion implantation into the open parts in the case of Embodiment 6, as shown in FIG. 33, is not carried out, and a strain-relaxed silicon germanium seed layer 18 similar to one shown in FIG. 34 is formed. Then, high temperature anneal is applied to the silicon germanium seed layer 18.

The present embodiment is similar to Embodiment 6 up to the step of defining the openings in the oxide film as shown in FIG. 32. Subsequently, the strain-relaxed silicon germanium seed layer 18 similar to the one shown in FIG. 34 is formed without carrying out the ion implantation into the open parts as shown in FIG. 33. Thereafter, the surface thereof is slightly, to a depth of, for example, 5 nm, oxidized, and heat treatment at a temperature in a range of 1000 to 1200° C. in an inert atmosphere containing a trace (e.g., 100 ppm) of oxygen is applied thereto for a few minutes. As a result of this step, strain of the silicon germanium seed layer 18 is sufficiently relaxed even without the presence of the implantation-damaged region 17. Further, after peeling off an oxide film formed in the upper part of the silicon germanium seed layer 18, the step of forming the amorphous silicon germanium film 19 as shown in FIG. 35, and succeeding steps thereafter, can be carried out in the same way as with the case of Embodiment 6.

Embodiment 8

Embodiment 8 represents a case where the fin-shaped strained silicon device according to Embodiment 3 and a strained silicon device on a common SGOI substrate are mounted on the same chip.

As with Embodiment 3, the substrate shown in FIG. 12 is used and an island-like region is left out by dry etching as shown FIG. 13. At this point, the island-like region is fully left out in a region where a strained silicon device is formed on the common SGOI substrate, and, an isolation region in a peripheral part of the substrate is etched until an embedded insulating film 13 exposed.

Figure 46:
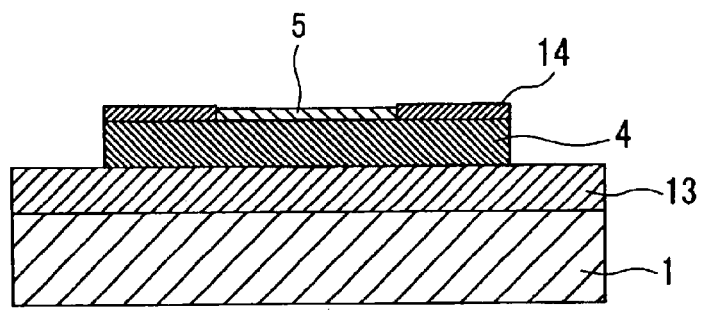
FIG. 46 is a sectional view for illustrating the principal part of a device according to Embodiment 8 of the invention, in the steps of fabrication.

Thereafter, prior to causing a strained silicon layer 5 to undergo selective epitaxial growth as shown in FIG. 14, portions of a surface oxide film layer 14, over active regions of a strained silicon device formed on the common SGOI substrate, are peeled off. By so doing, the strained silicon layer 5 can be formed in the center of the island-like region as shown in FIG. 46. Further, in steps corresponding to those shown in FIGS. 19 through 25, a region on the common SGOI substrate, where the strained silicon device is to be formed is covered with a mask. Thereafter, in a step corresponding to the step shown in FIG. 26 and succeeding steps, processing in common with that for Embodiment 3 or 4 can be executed. However, in order to secure insulation of the gate electrode 8, and to prevent occurrence of a parasitic transistor, the gate electrode 8 is formed on top of the island-like region so as not to reach the edge of the island-like region and the embedded insulating film 13 outside of the island-like region. As a result of those steps, a fin-shaped transistor, capable of attaining a high speed and short channel with ease, and a plane type device, in which leakage current is small, can be mounted.

Embodiment 9

The present embodiment provides by way of example a method of mounting a conventional insulated-gate field-effect silicon transistor (hereinafter referred to as a conventional transistor), of neither strained silicon nor SOI type, together with the transistor, in accordance with Embodiment 2 or 3, in the same chip.

With the present embodiment, a fabrication method may be based on the method of Embodiment 6. In order to align a height of a region where the conventional transistor is formed with a channel height of the transistor, e.g., according to Embodiment 2 or 3, a portion of a substrate 1, in a region other than the region for the conventional transistor, is first shaved down by use of dry etching.

Figure 47:
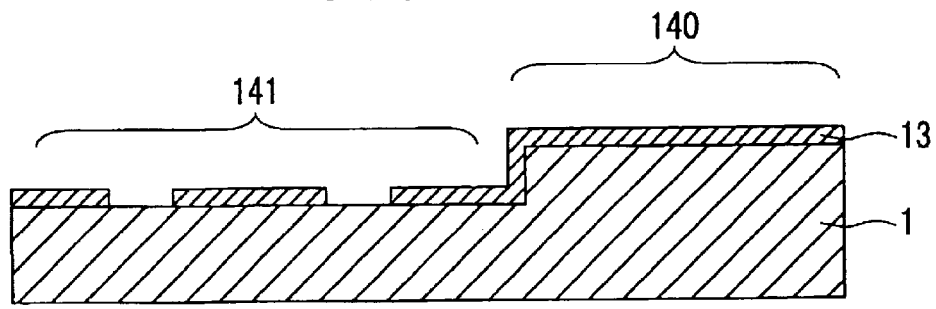
FIG. 47 is a sectional view showing a state in the steps of fabrication according to Embodiment 9 of the invention, wherein a difference in level is provided between a region for forming a plane-type common transistor and a region for forming the strained silicon transistor of the structure shown in Embodiment 2 by the steps of fabrication according to Embodiment 6.

Thereafter, an oxide film, similar to that shown in FIG. 32, is formed, and openings are defined therein. FIG. 47 is a sectional view showing this state. In the figure, there are shown only projections/depressions and an insulating film to be embedded. A region 140, where the substrate 1 is larger in thickness, is a conventional-transistor-forming region, while a region 141, where the substrate 1 is smaller in thickness, is a region where a transistor using strained silicon is formed. Thereafter, steps, corresponding to those as shown in FIGS. 33 through 37, are executed whereupon a polysilicon germanium film 21 and a surface oxide film 14 are formed on top of the oxide film 13 in the conventional-transistor-forming region.

Figure 42:
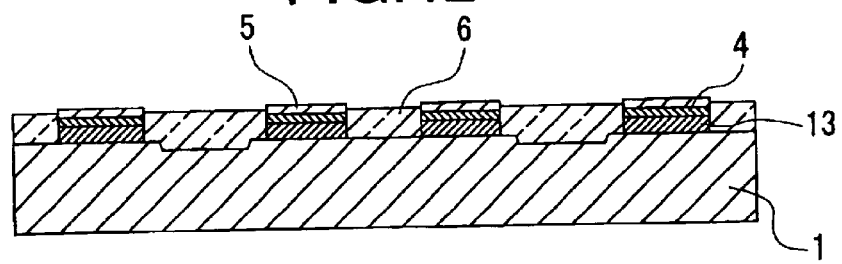
FIG. 42 is a sectional view for illustrating the principal part of the device according to Embodiment 6 of the invention, in the order of the steps of fabrication.
Figure 48:
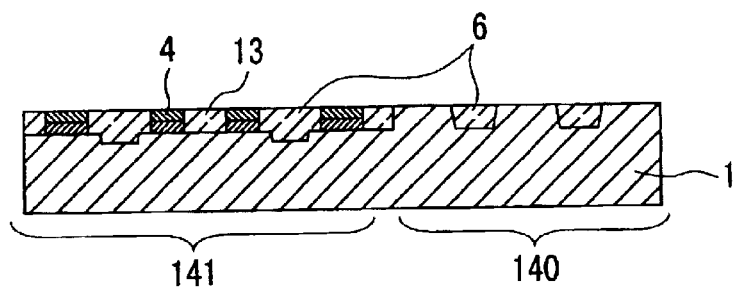
FIG. 48 is a sectional view showing a state wherein the surface height of the strain-relaxed silicon germanium layer 4 formed on top of the embedded insulating film 13 by the step of Embodiment 6 is aligned with that of the region for forming the common transistor by the step of fabrication according to Embodiment 9.
Figure 49:
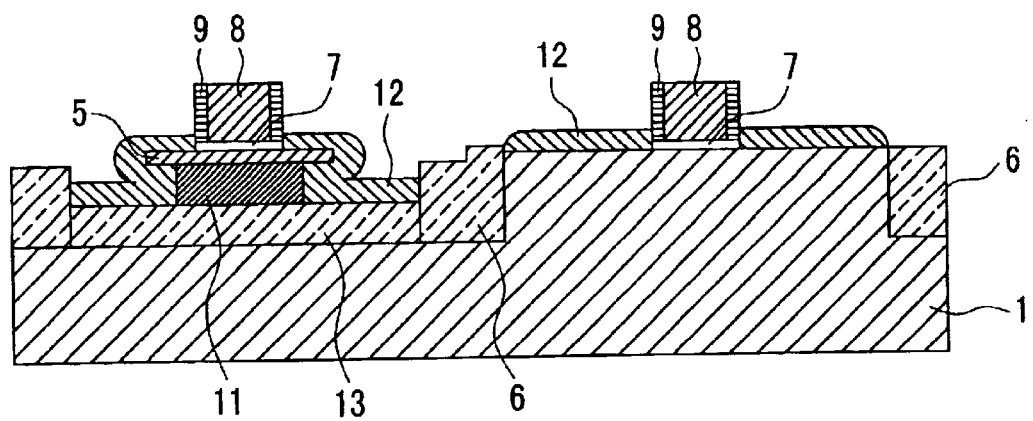
FIG. 49 is a sectional view of semiconductor device according to Embodiment 9, showing a state where the transistor according to the invention and the common transistor are formed on the same substrate.

Subsequently, in the case of mounting the conventional transistor together with the device according to Embodiment 2, the step of forming the STIs, as shown in FIG. 41, is executed. During this step, the polysilicon germanium film 21 and the surface oxide film 14, in the conventional-transistor-forming region, are removed by dry etching, and STIs are formed concurrently with formation of the device according to Embodiment 2, whereupon a state, as shown in FIG. 48, is created if the difference in height is proper. Thereafter, the strained silicon layer undergoes selective epitaxial growth, as shown in FIG. 42, to be followed by the forming of gate electrodes. This step is similar to, for example, the step as shown in FIG. 3. Further, an oxide film 10 for the second gate sidewall, as shown in FIG. 4, is deposited. Thereafter, in the conventional, transistor-forming region, etching of the sidewall is not executed, and the oxide film is etched, as shown in FIG. 8. At this point, in the conventional, transistor-forming region as well, etching is independently executed (by dividing a mask, for example) thereby leaving out the sidewall film of the gate electrode, and exposing the silicon substrate 1 in regions for forming a source and drain, respectively. Thereafter, the source and drain are formed. FIG. 49 is a sectional view showing an example of a transistor using the strained SOI substrate, as previously described, and a conventional transistor, mounted on the same chip. In FIG. 49, reference numeral 1 denotes a silicon substrate, 13 an embedded insulating film, 6 an isolation region, 11 an embedded oxide film, 12 source region or drain region, 5 a strained silicon layer, 7 a gate insulator, 8 a gate electrode, and 9 a gate sidewall insulating film.

In succeeding steps, the conventional transistor and the planar-type strained SOI transistor are completed on the same chip by use of the standard method.

Not only the combination of the planar-type strained SOI transistor with the conventional transistor, but also the combination of the fin-shaped strained SOI transistor with the conventional transistor, can be similarly fabricated. That is, after the step of aligning respective heights of both transistors with each other, as shown in FIG. 47, the steps shown in Embodiment 3 are executed, thereby enabling these transistors to be fabricated on the same chip. However, with reference to those steps, it is to be pointed out that the conventional, transistor-forming region should be covered with an oxide film or a mask.

As is apparent from the foregoing description of various embodiments of the invention, a transistor using strained silicon having higher mobility as compared with silicon for the channel can be fabricated so as to have a shorter gate length as compared with the conventional one, so that it is possible to attain both higher performance and lower power consumption of a semiconductor device. Further, since the SOI strained silicon device and a conventional silicon insulated-gate transistor can be fabricated on the same chip, it is possible to attain, generally, higher functionality of a semiconductor device.

As there are a wide variety of the embodiments for carrying out the invention, exemplary embodiments may be enumerated as follows:

(1) An insulated-gate field-effect transistor having a structure wherein a strained silicon layer is in contact with a silicon germanium layer, a portion of the silicon germanium layer, in contact with a portion of the strained silicon layer, is removed, a gate insulator and gate electrode are formed so as to be in contact with the strained silicon layer, a source electrode and drain electrode are formed on opposite sides of the gate electrode, respectively, so as to sandwich the gate electrode therebetween, and a channel is formed in the strained silicon layer.

(2) An insulated-gate field-effect transistor as set out under item (1) above, wherein silicon germanium is contained in the source electrode and the drain electrode.

(3) An insulated-gate field-effect transistor as set out under item (1) above, wherein the gate insulator and the gate electrode are formed on the top surface of a stacked structure made up of an etch stop layer, the silicon germanium layer, and the strained silicon layer, deposited in that order on top of a support substrate, and an opening is defined in either one or both of the strained silicon layers with the gate electrode sandwiched therebetween, thereby removing the silicon germanium layer by etching.

(4) An insulated-gate field-effect transistor as set out under item (3) above, wherein the etch stop layer is a strained silicon layer.

(5) An insulated-gate field-effect transistor as set out under item (3) above, wherein the etch stop layer is a silicon dioxide layer, silicon nitride layer, or mixed layer thereof.

(6) An insulated-gate field-effect transistor as set out under item (1) or (3) above, wherein an insulating film is embedded in a portion or portions of the silicon germanium layer, removed by etching.

(7) An insulated-gate field-effect transistor as set out under item (1) or (3) above, wherein the silicon germanium layer underneath the strained silicon layer underneath the gate electrode is completely removed.

(8) An insulated-gate field-effect transistor as set out under item (1) or (3) above, wherein a portion of the silicon germanium layer underneath the strained silicon layer underneath the gate electrode is completely removed.

(9) A semiconductor device comprising the insulated-gate field-effect transistor as set out under item (7) above, wherein the silicon germanium layer is completely removed, and the insulated-gate field-effect transistor as set out under item (8) above, wherein the portion of the silicon germanium layer is removed, formed on the same support substrate.

(10) An insulated-gate field-effect transistor wherein a bar-shaped strained silicon layer is formed on a support substrate, a gate insulator and gate electrode are formed so as to spread across the bar-shaped strained silicon layer, in the direction orthogonal to the longitudinal direction thereof, a source and drain are formed on opposite sides of the gate electrode, along the longitudinal direction of the bar-shaped strained silicon layer, respectively, and a channel is formed in a portion of the bar-shaped strained silicon layer, under the gate electrode, so as to extend in the longitudinal direction thereof.

(11) An insulated-gate field-effect transistor as set out under item (10) above, wherein the gate electrode is formed on both faces of the bar-shaped strained silicon layer, extending along the longitudinal direction of the bar-shaped strained silicon layer, and orthogonal to the gate insulator.

(12) An insulated-gate field-effect transistor as set out under item (10) above, wherein a silicon germanium layer is in contact with opposite ends of the bar-shaped strained silicon layer, in the longitudinal direction thereof.

(13) An insulated-gate field-effect transistor as set out under item (10) above, wherein a plurality of the bar-shaped strained silicon layers are in contact with the source and drain, and a plurality of channels are connected thereto.

(14) An insulated-gate field-effect transistor as set out under item (10) above, having a structure wherein a bar-shaped silicon germanium layer is formed on top of the support substrate, both ends of the bar-shaped silicon germanium layer are supported by a silicon germanium layer larger in width than the bar-shaped silicon germanium layer, a strained silicon layer is formed on the surface of the bar-shaped silicon germanium layer, a bar-shaped strained silicon layer is formed by removal of portions of the bar-shaped silicon germanium layer, in contact with the strained silicon layer, and both ends of the bar-shaped strained silicon layer are in contact with support parts of the silicon germanium layer.

(15) An insulated-gate field-effect transistor wherein a bar-shaped silicon germanium layer is formed on top of a support substrate, both ends of the bar-shaped silicon germanium layer are supported by a silicon germanium layer larger in width than the bar-shaped silicon germanium layer, a bar-shaped strained silicon layer is formed on the surface of the bar-shaped silicon germanium layer, a gate insulator and gate electrode are formed so as to spread across the bar-shaped strained silicon layers and the bar-shaped silicon germanium layer sandwiched therebetween, in the direction orthogonal to the longitudinal direction thereof, a source and drain are formed on opposite sides of the gate electrode, respectively, along the longitudinal direction of the bar-shaped strained silicon layers, and the bar-shaped silicon germanium layer sandwiched therebetween, and a channel is formed in a portion of the bar-shaped strained silicon layer, under the gate electrode, so as to extend in the longitudinal direction thereof.

(16) An insulated-gate field-effect transistor as set out under item (15) above, wherein the gate electrode is formed on both faces of the bar-shaped strained silicon layers and the bar-shaped silicon germanium layer sandwiched therebetween, along the longitudinal direction thereof, and orthogonal to the gate insulator.

(17) An insulated-gate field-effect transistor as set out under item (15) above, wherein a plurality of the bar-shaped strained silicon layers and the bar-shaped silicon germanium layers, each sandwiched therebetween, are in contact with the source and drain, and a plurality of the channels are connected thereto.

(18) A semiconductor device comprising the insulated-gate field-effect transistor as set out under item (10) above, wherein a silicon germanium layer is not in contact with the portion of the bar-shaped strained silicon layer, for forming the channel, and the insulated-gate field-effect transistor as set out under item (15) above, wherein the portion for forming the channel is made up of the bar-shaped strained silicon layers and the bar-shaped silicon germanium layer sandwiched therebetween, both the insulated-gate field-effect transistors being formed on the same support substrate.

(19) An insulated-gate field-effect transistor as set out under item (10) or (15) above, wherein the support substrate is a substrate with direction of crystal plane (100), and the longitudinal direction of the bar-shaped strained silicon layer is substantially parallel to a direction <100> of the support substrate.

(20) An insulated-gate field-effect transistor as set out under item (10) or (15) above, wherein the support substrate is a substrate with direction of crystal plane (100), and the longitudinal direction of the bar-shaped strained silicon layer is substantially parallel to a direction <110> of the support substrate.

(21) An insulated-gate field-effect transistor wherein the bar-shaped strained silicon layer, with the longitudinal direction thereof in the direction <100>, as described under item (19) above, and the bar-shaped strained silicon layer, with the longitudinal direction thereof in the direction <110>, as described under item (20) above, are formed on the same support substrate.

(22) An insulated-gate field-effect transistor as set out under item (10) or (15) above, wherein the support substrate is a substrate with direction of crystal plane (110), and the longitudinal direction of the bar-shaped strained silicon layer is substantially parallel to a direction <110> of the support substrate.

(23) An insulated-gate field-effect transistor as set out under item (10) or (15) above, wherein the support substrate is a substrate with direction of crystal plane (110), and the longitudinal direction of the bar-shaped strained silicon layer is substantially parallel to a direction <001> of the support substrate.

(24) An insulated-gate field-effect transistor wherein the bar-shaped strained silicon layer, with the longitudinal direction thereof in the direction <110>, as described under item (22) above, and the bar-shaped strained silicon layer, with the longitudinal direction thereof in the direction <001>, as described under item (23) above, are formed on the same support substrate.

(25) A semiconductor device wherein either or both of the source and drain of the insulated-gate field-effect transistor as set out under any of the preceding items (1), (3), (10) and (15), with the channel formed in the strained silicon layer or the bar-shaped strained silicon layer, are in electrical contact with the support substrate through an lower part of regions of the source and drain.

(26) A semiconductor device wherein the insulated-gate field-effect transistor as set out under any of the preceding items (1), (3), (10) and (15), with the channel formed in the strained silicon layer or the bar-shaped strained silicon layer, and a transistor with a channel formed in a planar strained silicon layer, grown on a silicon germanium layer, are formed on the same substrate.

(27) A semiconductor device wherein the insulated-gate field-effect transistor as set out under any of the preceding items (1), (3), (10) and (15), with the channel formed in the strained silicon layer or the bar-shaped strained silicon layer, and a transistor with a channel formed in a strain-less silicon layer, are formed on the same substrate.

(28) A semiconductor device as set out under item (26) or (27) above, a gate electrode height of the insulated-gate field-effect transistor as set out under any of the preceding items (1), (3), (10) and (15), with the channel formed in the strained silicon layer or the bar-shaped strained silicon layer, is identical to that of the transistor with the channel formed in the strain-less silicon layer.

(29) A method of fabricating the insulated-gate field-effect transistor as set out under any of the preceding items (1), (3) and (14), wherein the silicon germanium layer as described under any of the preceding items (1), (3) and (14) is removed by mixture of hydrogen peroxide and ammonia

(30) A method of fabricating the insulated-gate field-effect transistor as set out under any of the preceding items (1), (3), and (14), wherein the silicon germanium layer as described under any of the preceding items (1), (3) and (14) is removed by a mixed gas of oxygen and fluorine.

(31) A method of fabricating an insulated-gate field-effect transistor comprising the steps of forming an oxide film on the surface of a silicon substrate, defining an opening by etching a portion of the oxide film, implanting ions into the opening, causing silicon germanium seed crystals to grow in the opening, depositing amorphous silicon germanium on top of the opening and the oxide film, heating the amorphous silicon germanium to create silicon germanium crystals, and depositing a strained silicon layer on top of the silicon germanium crystals.

(32) A method of fabricating an insulated-gate field-effect transistor comprising the steps of forming an oxide film on the surface of a silicon substrate, defining an opening by etching a portion of the oxide film, causing silicon germanium seed crystals to grow in the opening, oxidizing the surface of the silicon germanium seed crystals, subjecting the silicon germanium seed crystals to high-temperature heat treatment, removing an oxide film on the surface of the silicon germanium seed crystals, depositing amorphous silicon germanium on top of the opening and the oxide film, heating the amorphous silicon germanium to create silicon germanium crystals, and depositing a strained silicon layer on top of the silicon germanium crystals.

(33) A method of fabricating an insulated-gate field-effect transistor as set out under item (32) above, wherein the silicon germanium seed crystals are subjected to the high-temperature heat treatment at a temperature in a range of 1000 to 1200° C.

(34) A method of fabricating an insulated-gate field-effect transistor as set out under item (32) above, wherein the strained silicon layer is deposited after a portion of the silicon germanium crystals is removed.

The present invention has an advantageous effect in that an insulated-gate field-effect transistor having high mobility and a short gate length, and a method of fabricating the same, can be provided.

The present invention has another advantageous effect in that a combination of a wide variety of transistors having different characteristics can be implemented on the same substrate. That is, for example, the insulated-gate field-effect transistor according to the invention, and a conventional silicon transistor or a SOI transistor, can be mounted on the same chip.

What is claimed is:

1. An insulated-gate field-effect transistor, comprising:
   a support substrate;
   a bar-shaped strained silicon layer on the support substrate;
   a gate insulator formed so as to spread across an upper surface of the bar-shaped strained silicon layer, in a direction orthogonal to a longitudinal direction of the bar-shaped strained silicon layer, and, covering at least a part of both sides of the bar-shaped strained silicon layer;
   a gate electrode formed on the gate insulator; and
   a source region and a drain region, placed in regions positioned on opposite sides of the gate electrode, respectively, and along the longitudinal direction of the bar-shaped strained silicon layer,
   wherein a channel is formed in a portion of the bar-shaped strained silicon layer, corresponding to a region on the underside of the gate electrode, in such a way as to extend along the longitudinal direction of the bar-shaped strained silicon layer.

2. An insulated-gate field-effect transistor according to claim 1, wherein the gate electrode is formed on the gate insulator on the sides of two faces of the bar-shaped strained silicon layer, extending along the longitudinal direction of the bar-shaped strained silicon layer.

3. An insulated-gate field-effect transistor according to claim 1, having a silicon germanium layer in contact with the bar-shaped strained silicon layer at opposite ends of the bar-shaped strained silicon layer, in the longitudinal direction thereof and under a region where the channel does not exist.

4. An insulated-gate field-effect transistor according to claim 1, wherein a plurality of the bar-shaped strained silicon layers are provided and the source region and the drain region formed such that the source region and the drain region are common to the plurality of the bar-shaped strained silicon layers, and are connected to a plurality of channels.

5. An insulated-gate field-effect transistor, comprising:

a support substrate;

a plurality of bar-shaped strained silicon layers disposed with longitudinal sides thereof, opposed to each other, on the support substrate;

a plurality of bar-shaped silicon germanium layers each disposed between adjacent layers of the plurality of the bar-shaped strained silicon layers;

a gate insulator formed so as to spread across the longitudinal sides of the plurality of the bar-shaped strained silicon layers and the plurality of the bar-shaped silicon germanium layers;

a plurality of gate electrodes formed on the gate insulator; and a source region and a drain region, formed in regions on opposite sides of the respective gate electrodes, respectively, and along the longitudinal direction of the plurality of the bar-shaped strained silicon layers and the plurality of the bar-shaped silicon germanium layers, wherein a plurality of channels is formed in regions of the plurality of the bar-shaped strained silicon layers, corresponding to the undersides of the respective gate electrodes, and on the side away from the support substrate.

6. An insulated-gate field-effect transistor according to claim 5, wherein the plurality of channels are formed on the sides of two faces of the respective bar-shaped strained silicon layers, along the direction intersecting the support substrate, respectively.

7. An insulated-gate field-effect transistor according to claim 5, wherein the source region and drain region are connected to a plurality of channel regions and the plurality of the bar-shaped strained silicon layers, respectively.

8. An insulated-gate field-effect transistor according to claim 1, wherein the support substrate is a substrate the top surface of which has direction of crystal plane (100), and the longitudinal direction of the bar-shaped strained silicon layer is substantially parallel to a direction <100> of the support substrate.

9. An insulated-gate field-effect transistor according to claim 4, wherein the support substrate is a substrate the top surface of which has direction of crystal plane (100), and the longitudinal direction of the bar-shaped strained silicon layers is substantially parallel to a direction <100> of the support substrate.

10. An insulated-gate field-effect transistor according to claim 1, wherein the support substrate is a substrate the top surface of which has direction of crystal plane (100), and the longitudinal direction of the bar-shaped strained silicon layer is substantially parallel to a direction <110> of the support substrate.

11. An insulated-gate field-effect transistor according to claim 4, wherein the support substrate is a substrate the top surface of which has direction of crystal plane (100), and the longitudinal direction of the bar-shaped strained silicon layers is substantially parallel to a direction <110> of the support substrate.

* * * * *